(12) United States Patent
Wu et al.

(10) Patent No.: US 12,087,756 B2
(45) Date of Patent: Sep. 10, 2024

(54) PROTECTIVE WAFER GROOVING STRUCTURE FOR WAFER THINNING AND METHODS OF USING THE SAME

(71) Applicant: Taiwan Semiconductor Manufacturing Company Limited, Hsinchu (TW)

(72) Inventors: Kuo-Ming Wu, Zhubei (TW); Ming-Che Lee, Tainan (TW); Hau-Yi Hsiao, Chiayi (TW); Cheng-Hsien Chou, Tainan (TW); Sheng-Chau Chen, Tainan (TW); Cheng-Yuan Tsai, Chu-Pei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/087,819

(22) Filed: Dec. 23, 2022

(65) Prior Publication Data
US 2023/0129760 A1 Apr. 27, 2023

Related U.S. Application Data

(63) Continuation of application No. 17/181,380, filed on Feb. 22, 2021, now Pat. No. 11,552,066.

(51) Int. Cl.
*H01L 21/30* (2006.01)
*H01L 21/268* (2006.01)
(Continued)

(52) U.S. Cl.
CPC ............ *H01L 25/50* (2013.01); *H01L 21/268* (2013.01); *H01L 23/3171* (2013.01);
(Continued)

(58) Field of Classification Search
CPC .................. H01L 25/50; H01L 21/268; H01L 23/3171; H01L 23/3185; H01L 23/5329;
(Continued)

(56) References Cited

U.S. PATENT DOCUMENTS 9,748,206 B1 * 8/2017 Huang .................. H01L 23/564
10,580,823 B2 * 3/2020 Zhang ..................... H01L 24/05

FOREIGN PATENT DOCUMENTS

CN 207834295 U * 9/2018 ....... H01L 27/14618

* cited by examiner

*Primary Examiner* — Niki H Nguyen
(74) *Attorney, Agent, or Firm* — The Marbury Law Group, PLLC

(57) ABSTRACT

A bonded assembly of a first wafer including a first semiconductor substrate and a second wafer including a second semiconductor substrate may be formed. The second semiconductor substrate may be thinned to a first thickness, and an inter-wafer moat trench may be formed at a periphery of the bonded assembly. A protective material layer may be formed in the inter-wafer moat trench and over the backside surface of the second semiconductor substrate. A peripheral portion of the second semiconductor substrate located outside the inter-wafer moat trench may be removed, and a cylindrical portion of the protective material layer laterally surrounds a remaining portion of the bonded assembly. The second semiconductor substrate may be thinned to a second thickness by performing at least one thinning process while the cylindrical portion of the protective material layer protects the remaining portion of the bonded assembly.

20 Claims, 19 Drawing Sheets

(51) Int. Cl.
 *H01L 21/46* (2006.01)
 *H01L 23/00* (2006.01)
 *H01L 23/31* (2006.01)
 *H01L 23/532* (2006.01)
 *H01L 25/00* (2006.01)
 *H01L 21/304* (2006.01)
 *H01L 21/306* (2006.01)
 *H01L 21/3065* (2006.01)
 *H01L 21/308* (2006.01)

(52) U.S. Cl.
 CPC ...... *H01L 23/3185* (2013.01); *H01L 23/5329* (2013.01); *H01L 24/94* (2013.01); *H01L 21/304* (2013.01); *H01L 21/30604* (2013.01); *H01L 21/30625* (2013.01); *H01L 21/3065* (2013.01); *H01L 21/3083* (2013.01); *H01L 24/05* (2013.01); *H01L 24/08* (2013.01); *H01L 2224/0557* (2013.01); *H01L 2224/08145* (2013.01); *H01L 2224/94* (2013.01)

(58) Field of Classification Search
 CPC . H01L 24/94; H01L 21/304; H01L 21/30604; H01L 21/3065; H01L 21/3083; H01L 24/05; H01L 24/08; H01L 2224/0557; H01L 2224/08145; H01L 2224/94; H01L 2924/014; H01L 2924/14; H01L 25/0657; H01L 2225/06513; H01L 24/13; H01L 2924/15311; H01L 2224/0401; H01L 25/0652; H01L 24/75; H01L 2224/81193; H01L 2221/68327; H01L 24/02; H01L 2224/73204; H01L 2224/04042; H01L 2224/32145; H01L 2224/0603; H01L 2224/81815; H01L 2224/16227; H01L 23/5226; H01L 21/76251; H01L 2224/04105; H01L 2224/12105; H01L 2225/06517; H01L 21/2007; H01L 2224/13009; H01L 2224/16058; H01L 2221/1078; H01L 2224/04073; H01L 2224/05; H01L 2224/25174; H01L 2224/40227; H01L 2224/73207; H01L 2224/85801; H01L 23/49827
See application file for complete search history.

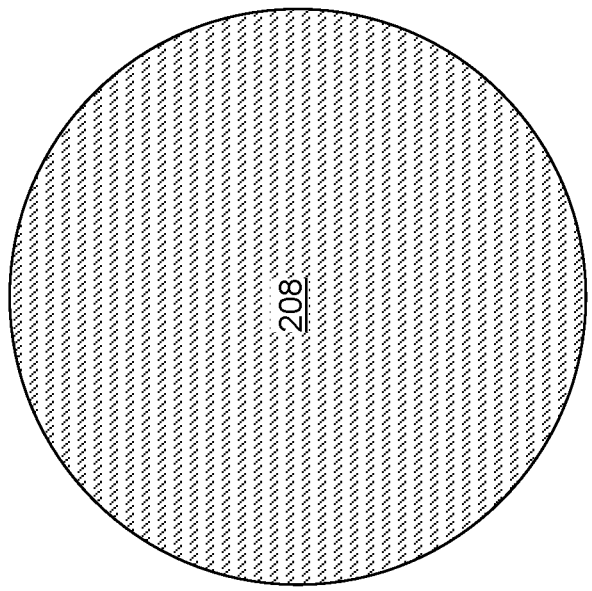
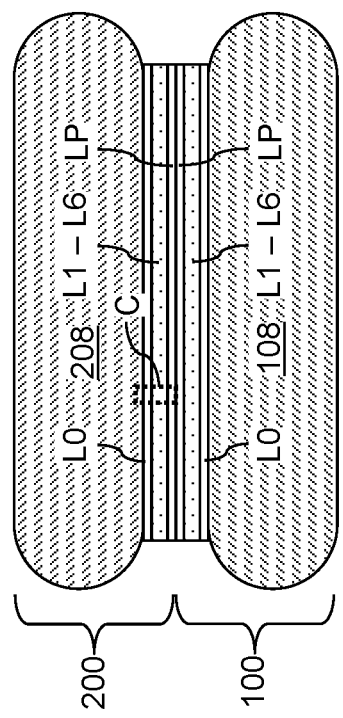
FIG. 1B
FIG. 1A

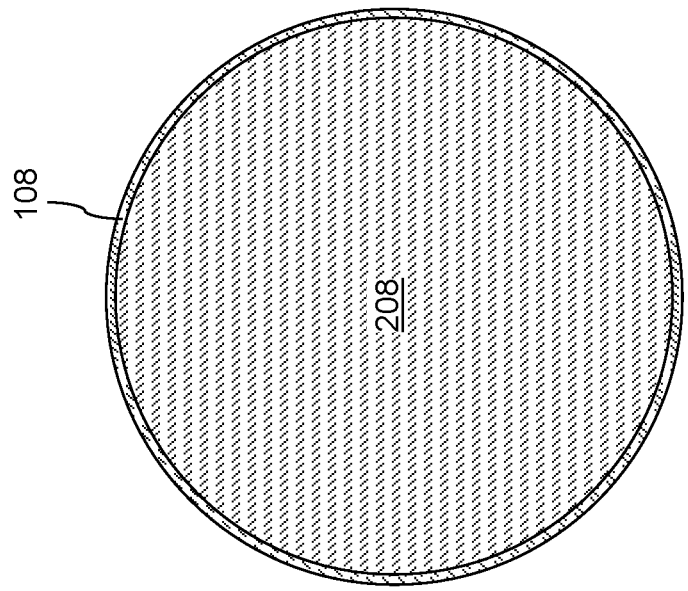
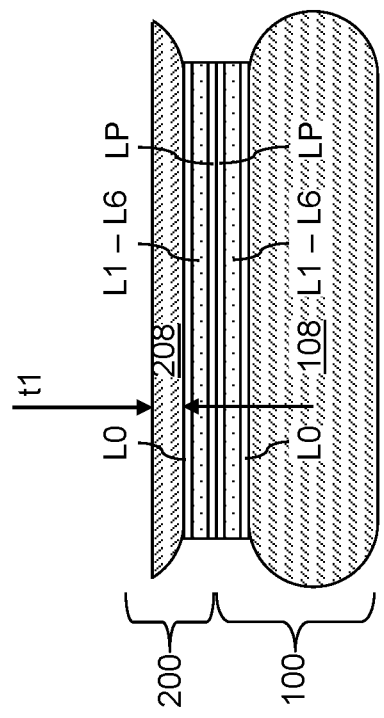
FIG. 2A
FIG. 2B

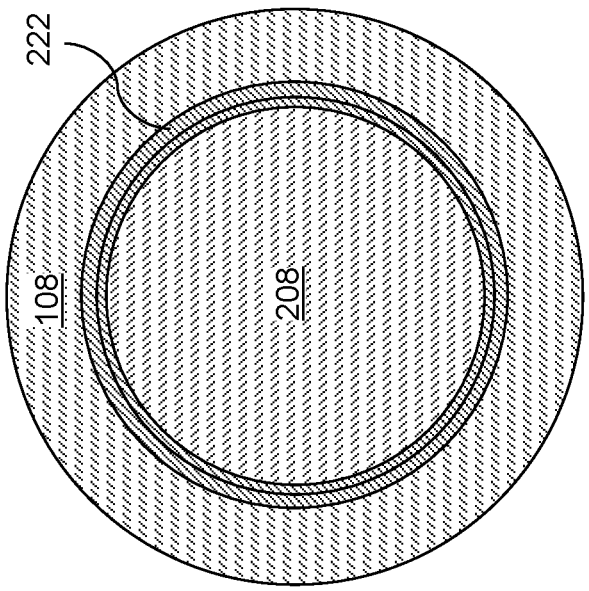
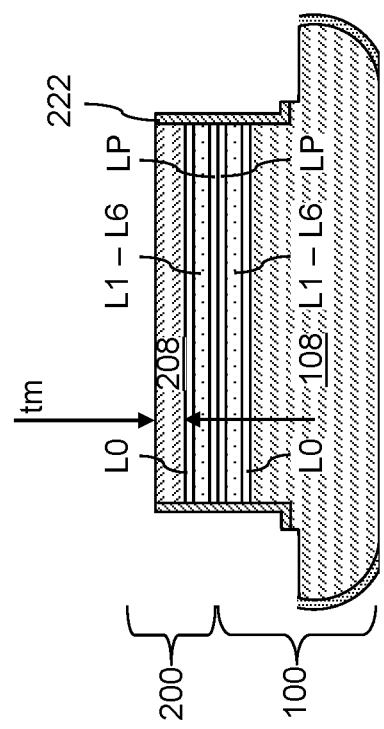
FIG. 6B
FIG. 6A

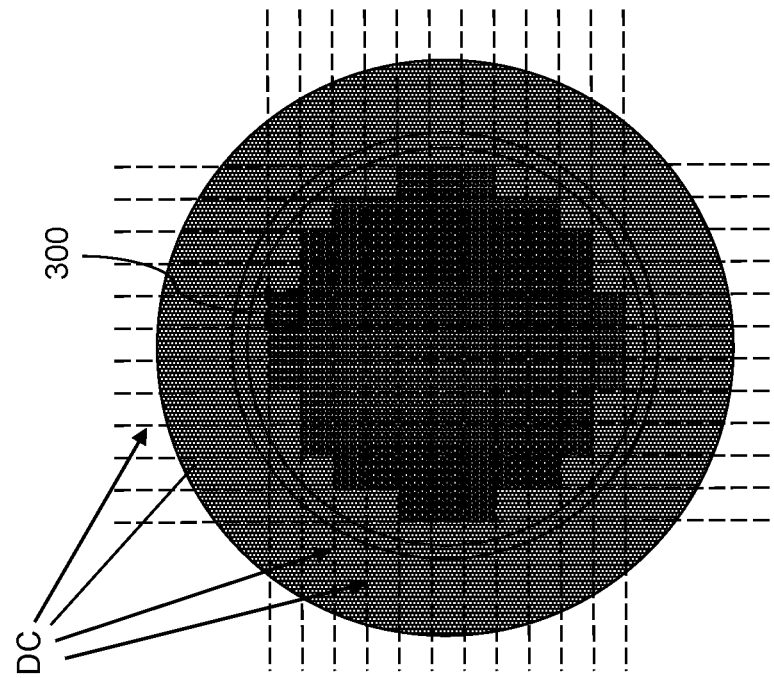
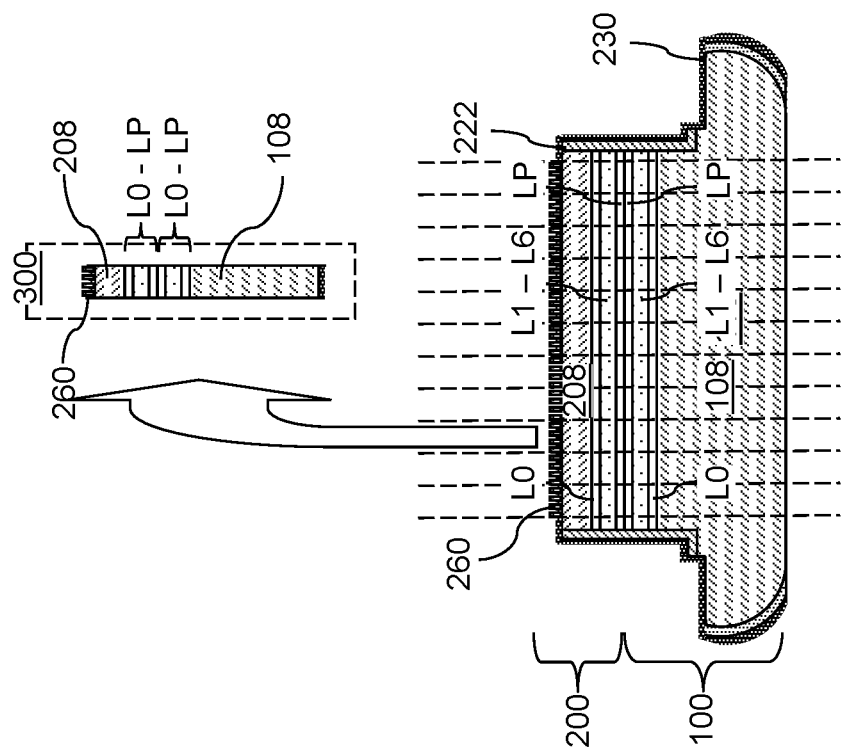
FIG. 11B
FIG. 11A

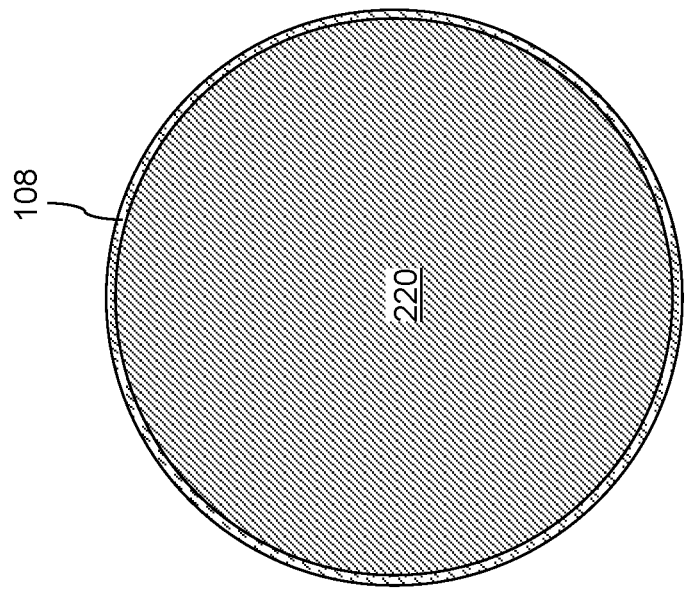
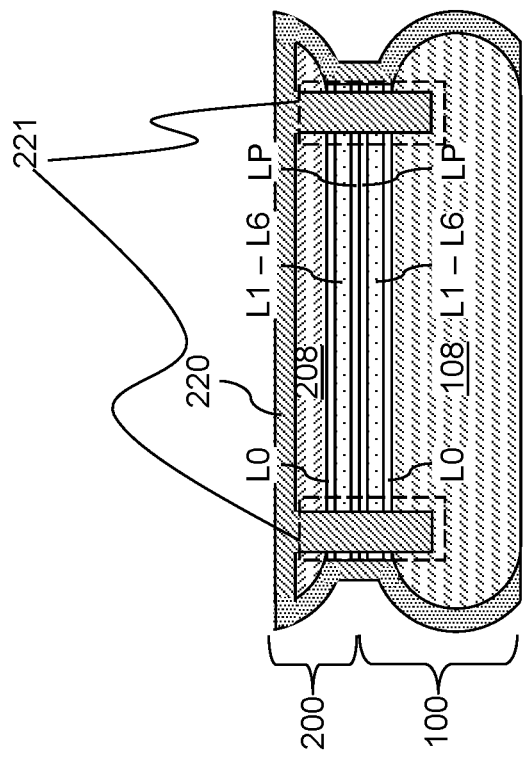
FIG. 12A
FIG. 12B

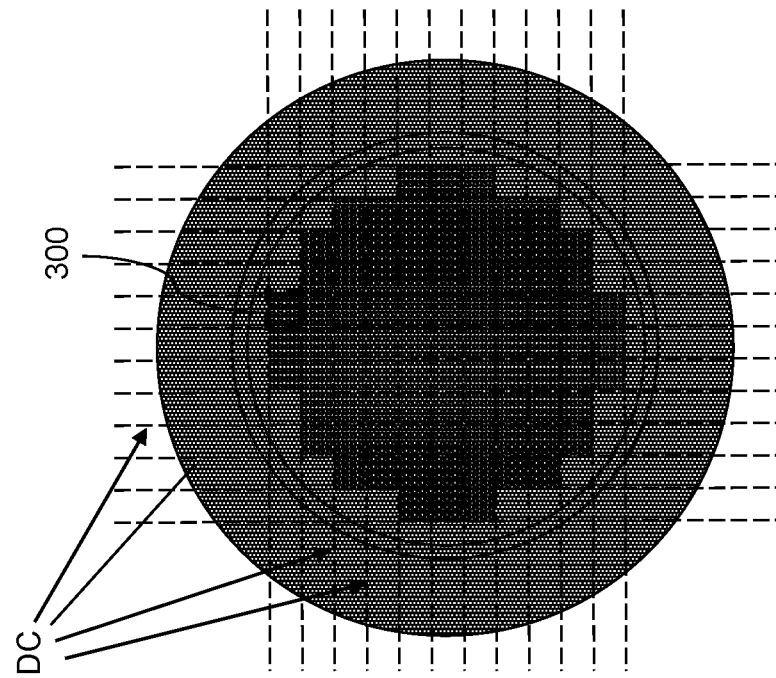
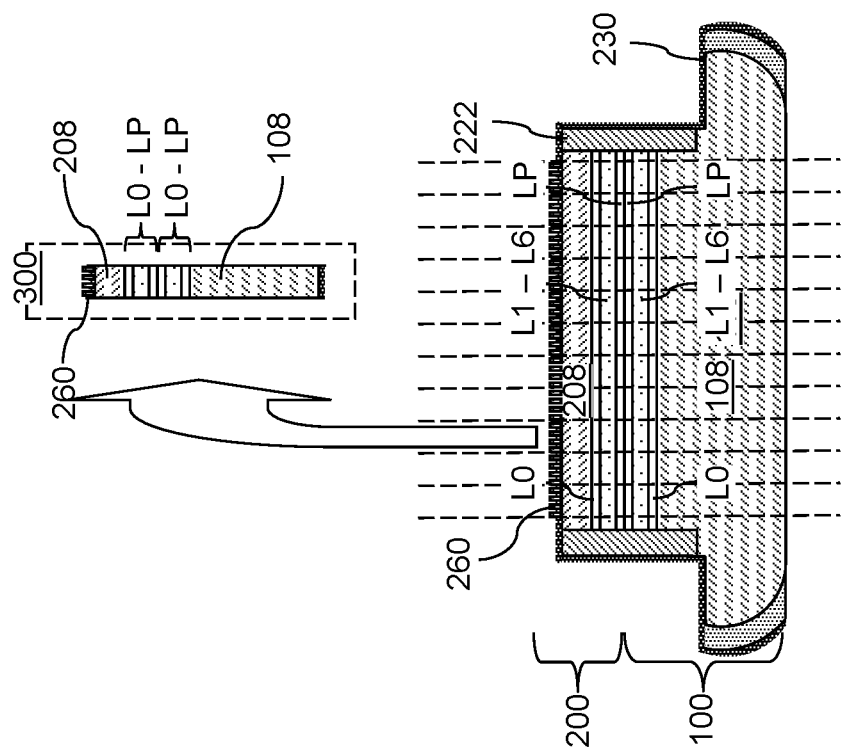
FIG. 14A
FIG. 14B

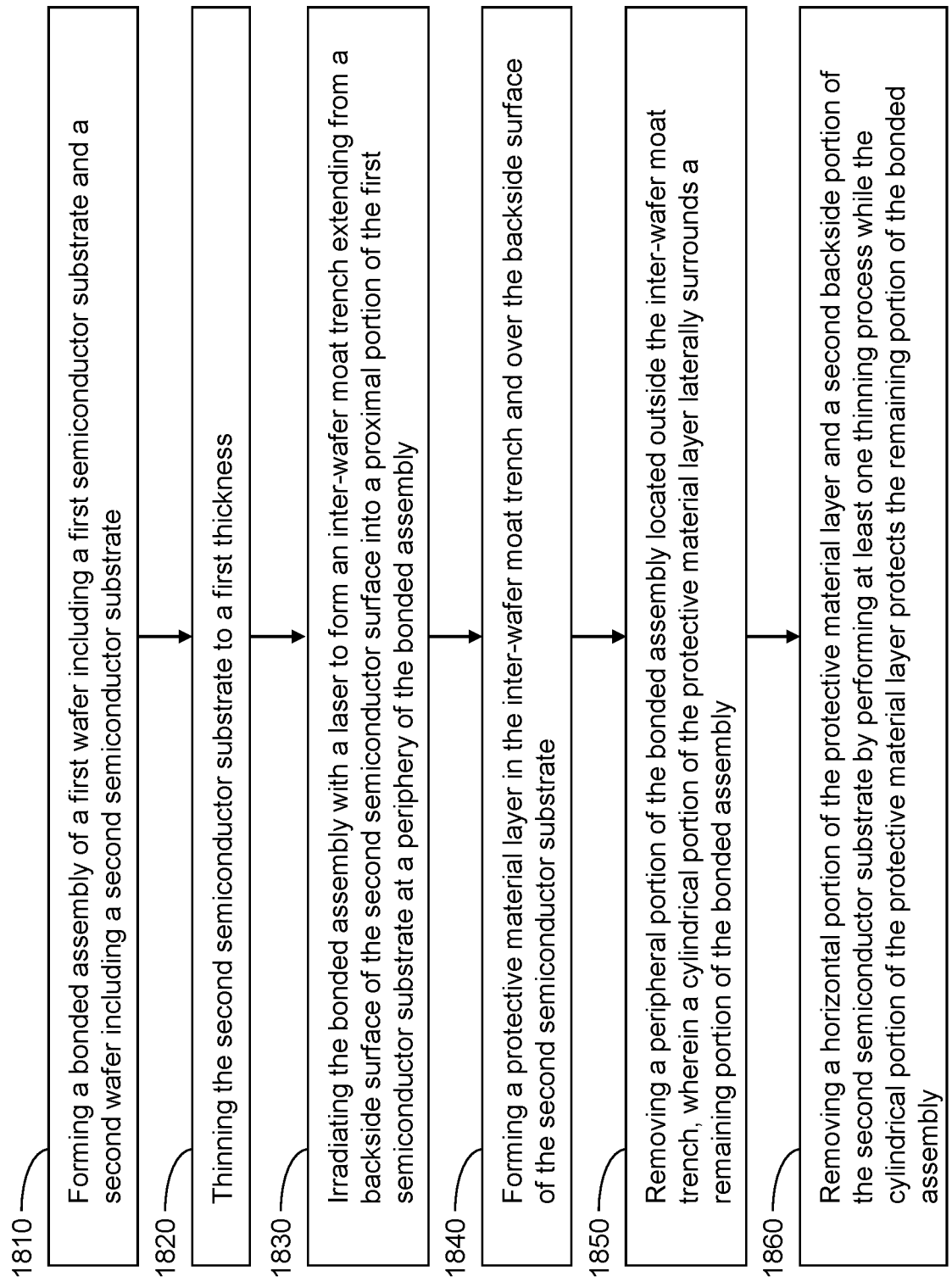

PROTECTIVE WAFER GROOVING STRUCTURE FOR WAFER THINNING AND METHODS OF USING THE SAME

RELATED APPLICATION

The instant application is a continuation application of U.S. application Ser. No. 17/181,380 entitled "Protective Wafer Grooving Structure for Wafer Thinning and Methods of Using the Same" filed on Feb. 22, 2021, the entire contents of which are incorporated herein by reference for all purposes.

BACKGROUND

Wafer thinning is used in conjunction with wafer bonding to provide a semiconductor chip including a vertical stack of two semiconductor dies. A first wafer including first semiconductor devices may be bonded to a second wafer including second semiconductor devices. One of the two bonded wafers may be thinned after bonding. Bonded and thinned semiconductor wafers may be subsequently diced to form multiple semiconductor chips, which may have higher density, multiple functions, and/or faster operational speed provided through vertical bonding of two semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of an exemplary structure after forming a bonded assembly of a first wafer and a second wafer according to an embodiment of the present disclosure.

FIG. 1B is a top-down view of the exemplary structure of FIG. 1A.

FIG. 2A is a vertical cross-sectional view of the exemplary structure after removing a first backside portion of a second semiconductor substrate according to an embodiment of the present disclosure.

FIG. 2B is a top-down view of the exemplary structure of FIG. 2A.

FIG. 6A is a vertical cross-sectional view of the exemplary structure after removing a horizontal portion of the protective material layer and a second backside portion of the second semiconductor substrate according to an embodiment of the present disclosure.

FIG. 6B is a top-down view of the exemplary structure of FIG. 6A.

FIG. 11A is a vertical cross-sectional view of the exemplary structure at the processing step of die singulation according to an embodiment of the present disclosure.

FIG. 11B is a top-down view of the exemplary structure of FIG. 11A.

FIG. 12A is a vertical cross-sectional view of a first alternative configuration of the exemplary structure after formation of a protective material layer according to an embodiment of the present disclosure.

FIG. 12B is a top-down view of the first alternative configuration of the exemplary structure of FIG. 12A.

FIG. 14A is a vertical cross-sectional view of the first alternative configuration of the exemplary structure at the processing step of die singulation according to an embodiment of the present disclosure.

FIG. 14B is a top-down view of the first alternative configuration of the exemplary structure of FIG. 14A.

FIG. 18 is a third flowchart illustrating steps for thinning a bonded structure including a first wafer and a second wafer according to an embodiment of the present disclosure.

DETAILED DESCRIPTION

Figure 1C:
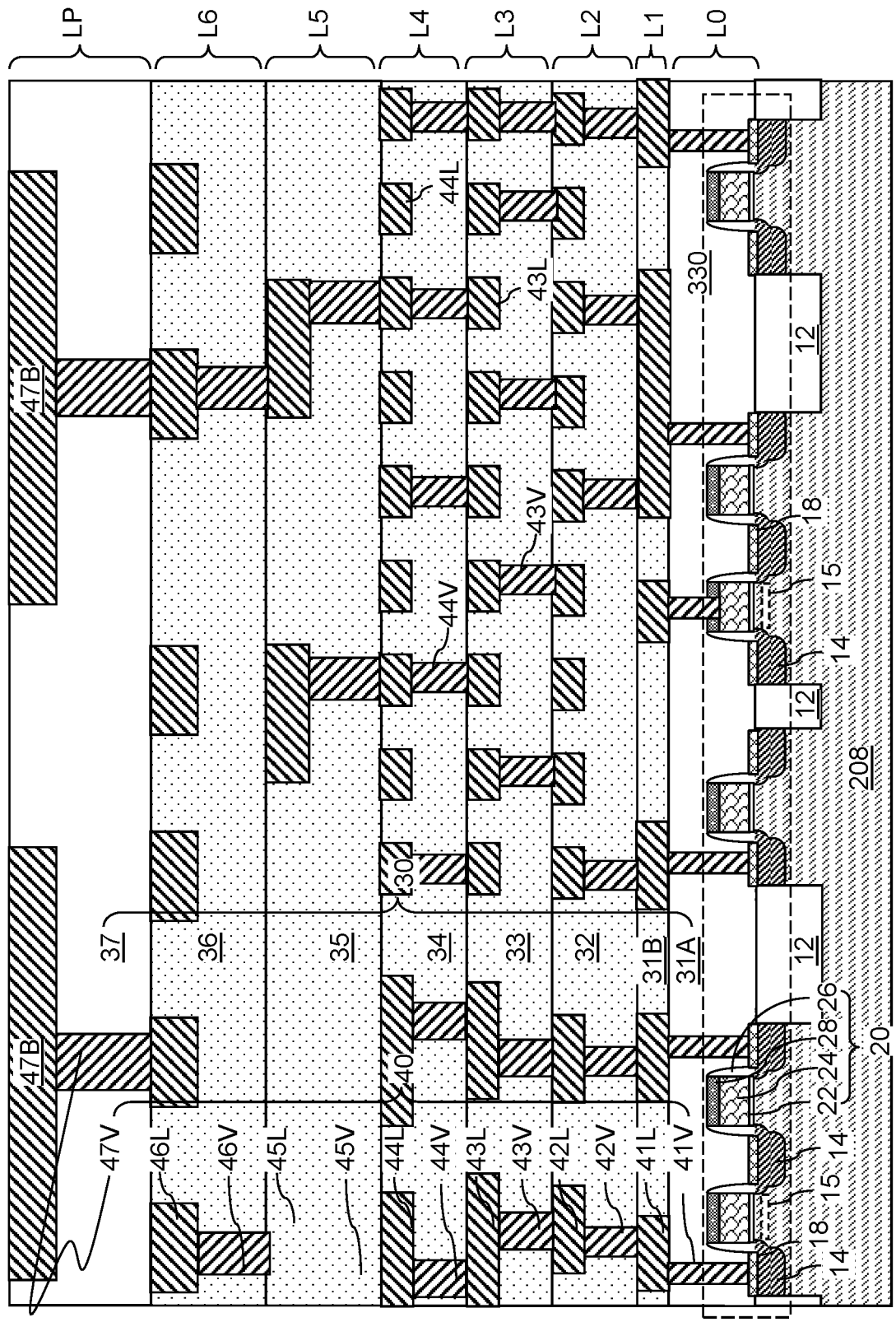
FIG. 1C is an upside-down magnified view of region C of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to generally to semiconductor devices, and specifically to a method of thinning a wafer using a protective wafer grooving structure and structures for implementing the same.

Referring to FIGS. 1A-1C, an exemplary structure according to an embodiment of the present disclosure is illustrated, which includes a bonded assembly of a first wafer 100 and a second wafer 200. The first wafer 100 and the second wafer 200 are provided as separate structures, and are subsequently bonded to each other to form the bonded assembly (100, 200) illustrated in FIGS. 1A-1C.

Each of the first wafer 100 and the second wafer 200 may include a respective semiconductor substrate. For example, the first wafer 100 may include a first semiconductor substrate 108, and the second wafer 200 may include a second semiconductor substrate 208. Each of the first semiconductor substrate 108 and the second semiconductor substrate 208 may comprise any semiconductor substrate such as a single crystalline silicon substrate having a diameter of 200 mm, 300 mm, or 450 mm and having a thickness in a range from 600 microns to 1 mm. Each of the semiconductor substrates (108, 208) may have a respective planar front surface and a respective planar backside surface that are parallel to each other. The edge of each semiconductor substrate (108, 208) may have edge rounding. In other words, a convex surface that changes the direction by 180 degrees in a vertical cross-sectional view may extend around the entire periphery of each semiconductor substrate (108, 208). The convex surface may connect the planar front surface and the planar backside surface of each semiconductor substrate (108, 208) so that each semiconductor substrate (108, 208) is devoid of any sharp edge. In one embodiment, each of the first semiconductor substrate 108 and the second semiconductor substrate 208 may include a respective commercially available single crystalline silicon substrate having a same diameter.

Each of the first wafer 100 and the second wafer 200 may be provided by forming semiconductor devices on a respective semiconductor substrate (108, 208) and by forming a respective set of interconnect-level structures (L0-L6) and a respective pad-level structure LP. The semiconductor devices formed on the first semiconductor substrate 108 are herein referred to as first semiconductor devices, and the semiconductor devices formed on the second semiconductor substrate 208 are herein referred to as second semiconductor devices. The interconnect-level structures (L0-L6) include first-wafer interconnect-level structures (L0-L6) that may be formed on the first semiconductor substrate 108 and incorporated into the first wafer 100, and second-wafer interconnect-level structures (L0-L6) that may be formed on the second semiconductor substrate 208 and incorporated into the second wafer 200.

The first-wafer interconnect-level structures (L0-L6) include dielectric material layers, which are herein referred to as first interconnect-level dielectric layers. The first interconnect-level dielectric layers having formed therein metal interconnect structures, which are herein referred to as first metal interconnect structures. Thus, the first wafer 100 comprises first metal interconnect structures formed within first interconnect-level dielectric layers. The second-wafer interconnect-level structures (L0-L6) include dielectric material layers, which are herein referred to as second interconnect-level dielectric layers. The second interconnect-level dielectric layers have formed therein metal interconnect structures, which are herein referred to as second metal interconnect structures. Thus, the second wafer 100 comprises second metal interconnect structures formed within second interconnect-level dielectric layers.

Each pad-level structure LP includes a pad-level dielectric layer and bonding pads formed within the pad-level dielectric layer. The first wafer 100 includes a first pad-level dielectric layer having formed therein first bonding pads. The second wafer 200 includes a second pad-level dielectric layer 37 (see FIG. 1C) having formed therein second bonding pads 47B. The first pad-level structure LP may be formed on top of the first-wafer interconnect-level structures (L0-L6), and the second pad-level structure LP may be formed on top of the second-wafer interconnect-level structures (L0-L6). Thus, each wafer (100, 200) may include a respective set of a semiconductor substrate (108 or 208), a respective set of interconnect-level structures (L0-L6), and a respective pad-level structure LP.

FIG. 1C illustrates the semiconductor devices 330 and the interconnect-level structures (L0-L6) that may be formed on the second semiconductor substrate 208. Similar semiconductor devices 330 and interconnect-level structures (L0-L6) may be formed on the first semiconductor substrate 108. While the present disclosure provides detailed description on components of the second wafer 200 only, it is understood that the first wafer 100 may have corresponding components at some levels or at each level. Further, while the present disclosure provides only complementary metal-oxide-semiconductor (CMOS) devices as the second semiconductor devices, it is understood that any other semiconductor device (such as memory devices, radio-frequency devices, image-sensing devices, passive devices, etc.) may be added to, or may replace, the CMOS devices in the second wafer 200.

In an illustrative example, the second semiconductor substrate 208 may include a bulk semiconductor substrate such as a silicon substrate in which the semiconductor material layer continuously extends from a top surface of the second semiconductor substrate 208 to a bottom surface of the second semiconductor substrate 208, or a semiconductor-on-insulator layer including a semiconductor material layer as a top semiconductor layer overlying a buried insulator layer (such as a silicon oxide layer) and a handle semiconductor substrate.

Semiconductor devices 330 such as field effect transistors may be formed on, and/or in, the second semiconductor substrate 208. For example, shallow trench isolation structures 12 may be formed in an upper portion of the second semiconductor substrate 208 by forming shallow trenches and subsequently filling the shallow trenches with a dielectric material such as silicon oxide. Various doped wells (not expressly shown) may be formed in various regions of the upper portion of the second semiconductor substrate 208 by performing masked ion implantation processes.

Gate structures 20 may be formed over the top surface of the second semiconductor substrate 208 by depositing and patterning a gate dielectric layer, a gate electrode layer, and a gate cap dielectric layer. Each gate structure 20 may include a vertical stack of a gate dielectric 22, a gate electrode 24, and a dielectric gate cap 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed using the gate structures 20 as self-aligned implantation masks to form deep active regions, which may include deep source regions and deep drain regions. Upper portions of the deep active regions may overlap with portions of the extension implantation regions. Each combination of an extension implantation region and a deep active region constitutes an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the second semiconductor substrate 208. Each field effect transistor may include a gate structure 20, a semiconductor channel 15, a pair of active regions 14 (one of which functions as a source region and another of which functions as a drain region), and optional metal-semiconductor alloy regions 18. A complementary metal-oxide-semiconductor (CMOS) circuit 330 may be provided on the second semiconductor substrate 208, which may include a periphery circuit for the array(s) of resistive memory elements to be subsequently formed.

Various interconnect-level structures may be subsequently formed. In an illustrative example, the interconnect-level structures (L0-L6) may include a contact-level structure L0, a first interconnect-level structure L1, a second interconnect-level structure L2, a third interconnect-level structure L3, a fourth interconnect-level structure L4, a fifth interconnect-level structure L5, and a sixth interconnect-level structure L6. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 may include a first interconnect-level dielectric layer 31B and first metal lines 41L formed within the first interconnect-level dielectric layer 31B. The first interconnect-level dielectric layer 31B is also referred to as a first line-level dielectric layer. The first metal lines 41L may contact a respective one of the contact via structures 41V. The second interconnect-level structure L2 may include a second interconnect-level dielectric layer 32. The second interconnect-level dielectric layer 32 may include a stack of a first via-level dielectric material layer and a second line-level dielectric material layer or a line-and-via-level dielectric material layer. The second interconnect-level dielectric layer 32 having formed therein second interconnect-level metal interconnect structures (42V, 42L), which may include first metal via structures 42V and second metal lines 42L. Top surfaces of the second metal lines 42L may be coplanar with the top surface of the second interconnect-level dielectric layer 32.

The third interconnect-level metal interconnect structures (43V, 43L) may include second metal via structures 43V and third metal lines 43L formed within third interconnect-level dielectric layer 33. Additional interconnect-level structures (L4, L5, L6) may be subsequently formed. For example, the additional interconnect-level structures (L4, L5, L6) may include a fourth interconnect-level structure L4, a fifth interconnect-level structure L5, and a sixth interconnect-level structure L6. The fourth interconnect-level structure L4 may include a fourth interconnect-level dielectric layer 34 having formed therein fourth interconnect-level metal interconnect structures (44V, 44L), which may include third metal via structures 44V and fourth metal lines 44L. The fifth interconnect-level structure L5 may include a fifth interconnect-level dielectric layer 35 having formed therein fifth interconnect-level metal interconnect structures (45V, 45L), which may include fourth metal via structures 45V and fifth metal lines 45L. The sixth interconnect-level structure L6 may include a sixth interconnect-level dielectric layer 36 having formed therein sixth interconnect-level metal interconnect structures (46V, 46L), which may include fifth metal via structures 46V and sixth metal lines 46L.

A pad-level structure LP, which is herein referred to as a second pad-level structure, may be formed above the interconnect-level structures (L0-L6). The pad-level structure LP may include a pad-level dielectric layer 37 having formed therein terminal metal via structures 47V and metal bonding pads 47B. The metal bonding pads 47B may be configured for metal-to-metal bonding (such as copper-to-copper bonding).

Each interconnect-level dielectric layer may be referred to as an interconnect-level dielectric (ILD) layer 30. Each interconnect-level metal interconnect structures may be referred to as a metal interconnect structure 40. Each combination of a metal via structure and an overlying metal line located within a same interconnect-level structure (L1-L6) may be formed sequentially as two distinct structures by using two single damascene processes, or may be simultaneously formed as a unitary structure using a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Various etch stop dielectric layers and dielectric capping layers may be inserted between vertically neighboring pairs of ILD layers 30, or may be incorporated into one or more of the ILD layers 30.

While the present disclosure is described using an embodiment in which a set of seven interconnect-level structures (L0-L6) are formed, embodiments are expressly contemplated herein in which a different number of interconnect-level structures is used. The number of interconnect-level structures (L0-L6) within each wafer may be in a range from 1 to 20, such as from 2 to 10, and may be independent of each other.

According to an aspect of the present disclosure, at least one interconnect-level dielectric (ILD) layer 30 within the combination of the first wafer 100 and the second wafer 200 comprises at least one low-k dielectric material layer including a dielectric material having a dielectric constant less than 3.9. In other words, at least one low-k dielectric material layer including a dielectric material having a dielectric constant less than 3.9 is located between the first semiconductor substrate 108 and the second semiconductor substrate 208 as one or more components of the interconnect-level structures (L0-L6) of the first wafer 100 and/or as one or more components of the interconnect-level structures (L0-L6) of the second wafer 200. In one embodiment, at least one low-k dielectric material layer including a dielectric material having a dielectric constant less than 3.9 is located between the first semiconductor substrate 108 and the second semiconductor substrate 208 as one or more components of the interconnect-level structures (L1-L6) other than the contact-level structure L0 of the first wafer 100 and/or as one or more components of the interconnect-level structures (L1-L6) other than the contact-level structure L0 of the second wafer 200. In one embodiment, the dielectric material of the at least one low-k dielectric material layer comprises a porous dielectric material having a dielectric constant in a range from 2.0 to 2.8, which is known in the art as an extremely low-k (ELK) dielectric material.

In one embodiment, the porous dielectric material of the at least one low-k dielectric material layer may include a silicon oxide-based low-k material having a porous structure, which is adapted to form a porogen-doped SiCO-based material by incorporating the porogen into a carbon-doped silicon oxide-based dielectric material. In an embodiment, the porous dielectric material of the at least one low-k dielectric material layer may include a porous organosilicate glass. Generally, the porogen may be any suitable a pore generating material, such as a hydrocarbon.

In one embodiment, at least one interconnect-level dielectric (ILD) layer 30 within the combination of the first wafer 100 and at least another ILD layer 30 within the second wafer 200 comprise low-k dielectric material layers including a dielectric material having a dielectric constant less than 3.9, such as an ELK dielectric material. In one embodiment, the first wafer 100 may include first low-k dielectric material layers located on the first semiconductor substrate 108 and having formed therein first metal interconnect structures, and the second wafer 200 may include second low-k dielectric material layers located on the second semiconductor substrate 208 and having formed therein second metal interconnect structures.

In one embodiment, the first wafer 100 comprises first semiconductor devices formed on the first semiconductor substrate 108 and first bonding pads formed within a first pad-level dielectric layer. The first low-k dielectric material layers may be located between the first semiconductor devices and the first pad-level dielectric layer. The second wafer 200 comprises second semiconductor devices formed on the second semiconductor substrate 208 and second bonding pads 47B formed within a second pad-level dielectric layer 37. The second low-k dielectric material layers are located between the second semiconductor devices and the second pad-level dielectric layer.

The at least one low-k dielectric material layer provided in the first wafer 100 and/or the second wafer 200 may reduce RC delay of signals that pass through the metal interconnect structures in the first wafer 100 and/or the second wafer 200 by reducing the capacitive coupling among the metal interconnect structures. Generally, the RC delay of signals in the metal interconnect structures is proportional to the product of the resistance of the metal line through which the signal travels and the capacitance between the metal line and adjacent metal lines. Since the capacitance of any capacitive structure is proportional to the dielectric constant of the dielectric material between the conductive plates of the capacitive structure, use of the at least one low-k dielectric material layer provided in the first wafer 100 and/or the second wafer 200 may reduce the capacitance of metal lines, and accordingly, the RC delay, and may enhance performance of the semiconductor devices in the first wafer 100 and/or the second wafer 200. Further, signal delay between signals transmitted between the first wafer 100 and the second wafer 200 may be reduced.

While use of the at least one low-k dielectric material layer in the first wafer 100 and/or the second wafer 200 improves the RC delay, the porous structure of the at least one low-k dielectric material layer in the first wafer 100 and/or the second wafer 200 causes the at least one low-k dielectric material layer to be prone to structural and chemical damages during subsequent processing steps used to thin a semiconductor substrate, such as the second semiconductor substrate 208. Methods and structures of embodiments of the present disclosure may be used to reduce or eliminate the structural and/or chemical damages to the at least one low-k dielectric material layer, the details of which are described in detail herebelow.

The first wafer 100 and the second wafer 200 may be bonded to each other by bonding the second bonding pads formed within the second pad-level dielectric layer of the second wafer 200 to the first bonding pads formed within the first pad-level dielectric layer of the first wafer 100. Metal-to-metal bonding (such as copper-to-copper bonding) may be used. For example, the assembly of the first wafer 100 and the second wafer 200 may be annealed at an elevated temperature in a range from 250 degrees Celsius to 450 degrees Celsius to induce metal-to-metal bonding between the first bonding pads and the second bonding pads. In one embodiment, the first pad-level dielectric layer and the second pad-level dielectric layer may include silicon oxide, and oxide-to-oxide bonding between the first pad-level dielectric layer and the second pad-level dielectric layer may be induced prior to metal-to-metal bonding by annealing the assembly of the first wafer 100 and the second wafer 200 at an elevated temperature in a range from 150 degrees Celsius to 350 degrees Celsius while the first metal pads contact the second metal pads and the first pad-level dielectric layer contacts the second pad-level dielectric layer.

Referring to FIGS. 2A and 2B, the second semiconductor substrate 208 may be thinned by removing a backside portion (which is hereafter referred to as a first backside portion) of the second semiconductor substrate 208. Thinning of the second semiconductor substrate 208 may be effected, for example, by grinding. A wafer backgrinding equipment may be used to mechanically grind the first backside portion of the second semiconductor substrate 208 until a remaining front portion (i.e., the portion facing the first wafer 100) has a first thickness t1. The first thickness t1 may be in a range from 2 microns to 100 microns, such as from 5 microns to 50 microns. A grind wheel with an extremely fine diamond grit may be used to grind the first backside portion of the second semiconductor substrate 208 and to provide a reasonably planar backside surface on a remaining portion of the second semiconductor substrate 208. Other suitable processes to thin the second semiconductor substrate 208 are within the contemplated scope of this disclosure.

Figure 3B:
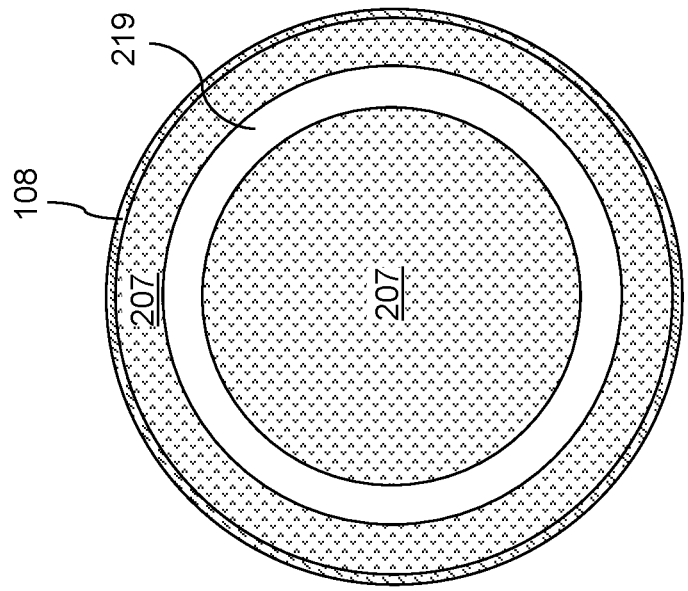
FIG. 3B is a top-down view of the exemplary structure of FIG. 3A.
Figure 3A:
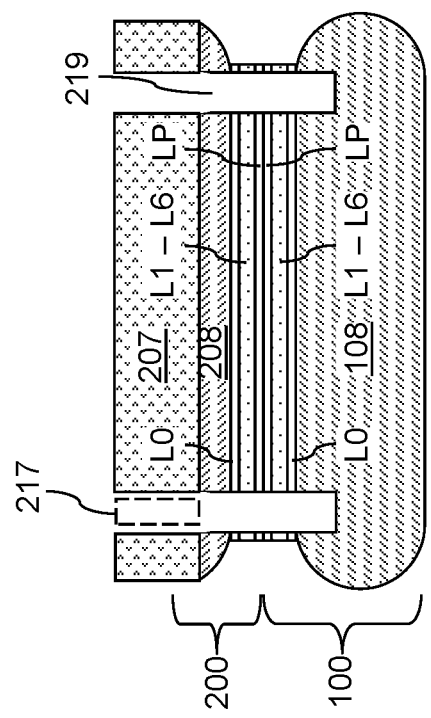
FIG. 3A is a vertical cross-sectional view of the exemplary structure after formation of an inter-wafer moat trench according to an embodiment of the present disclosure.

Referring to FIGS. 3A and 3B, an etch mask layer 207 including an etch mask material may be applied on the backside surface of the second semiconductor substrate 208, and may be patterned to form an annular channel 217 (which has a shape of an annular opening) in proximity to the periphery of the backside surface of the second semiconductor substrate 208. The etch mask material may include a polymer material such as polyimide or a photoresist material (such as a positive photoresist material). Patterning of the etch mask material may be performed by mechanically scribing the annular channel 217 through the etch mask material. In one embodiment, a scribe may be positioned at a periphery of the second semiconductor substrate 208 such that the scribe is pushed through the etch mask material to the backside surface of the second semiconductor substrate 208, and the scribe and the assembly of the bonded wafers may be relatively rotated around a vertical axis passing through the geometrical center of the bonded assembly. The scribe and/or the bonded wafers may move. The physically exposed surfaces of the bonded assembly may have a rotational symmetry prior to formation of the annular channel 217 through the etch mask material, and the annular channel 217 through the etch mask material may be formed to preserve the rotational symmetry of the physically exposed surfaces of the exemplary structure.

The annular channel 217 may have a uniform width throughout, which may be in a range from 0.1 mm to 3 mm, such as from 0.2 mm to 1 mm, although lesser and greater widths may also be used. The annular channel 217 may be formed inside a periphery of the interface between the first wafer 100 and the second wafer 200. The lateral offset distance between the annular channel 217 and the periphery of the interface of the first wafer 100 and the second wafer 200 may be in a range from 0.05 mm to 2 mm, such as from 0.1 mm to 1 mm, although lesser and greater lateral offset distances may also be used.

An anisotropic etch process may be performed to transfer the pattern of the annular channel 217 in the etch mask layer through the underlying portions of the second wafer 200, through the interface between the first wafer 100 and the second wafer 200, and into an upper portion of the first wafer 100. An anisotropic etch process is an etch process in which material is removed in essentially one direction. This is in contrast to an isotropic etching process in which material is essentially removed in all directions. As an example, an anisotropic process used in a trench may extend the depth of the trench without widening the trench. In contrast, an isotropic etch used in the trench would both deepen and widen the trench. Anisotropic etching may comprise, for example, a reactive ion etch process employing a plasma of an etchant gas such as sulfur hexafluoride. For example, a deep silicon etch process commonly known as the Bosch process may be employed.

The anisotropic etch process may include a series of etch steps using different etch chemistries that etch through the materials of the second semiconductor substrate 208, the various interconnect-level dielectric (ILD) layers 30 and metal interconnect structures 40 (if present in the area that underlies the annular channel 217 in the etch mask material), and the proximal portion of the first semiconductor substrate 108 that faces the second semiconductor substrate 208. An inter-wafer moat trench 219 that replicates the pattern of the annular channel 217 in the etch mask layer may be formed through each of the first interconnect-level dielectric layers 30 in the first wafer 100 and each of the second interconnect-level dielectric layers 30 in the second wafer 200. A moat trench refers to a trench that laterally separates an inner portion of a patterned structure and an outer portion of the patterned structure such that the trench laterally surrounds the inner portion of the patterned structure and is laterally surrounded by the outer portion of the patterned structure. An inter-wafer trench refers to a trench that extends through the interface between a first wafer and a second wafer. Generally, the inter-wafer moat trench 219 may vertically extend from a backside surface of the second semiconductor substrate 208 into a proximal portion of the first semiconductor substrate 108 at a periphery of the bonded assembly. The depth of the inter-wafer moat trench 219 may be in a range from 3 microns to 100 microns, although lesser and greater depths may also be used.

The inter-wafer moat trench 219 may have a straight inner sidewall and a straight outer sidewall. Each of the straight inner sidewall and the straight outer sidewall may vertically extend from the backside surface of the second semiconductor substrate 208 to a bottom surface of the inter-wafer moat trench 219 that is located within the first semiconductor substrate 108. The straight inner sidewall and the straight outer sidewall may be vertical, or may have a taper angle, which may be greater than 0 degree and less than 5 degrees, and may be less than 2 degrees. Each of the straight inner sidewall and the straight outer sidewall may have a substantially cylindrical shape. In one embodiment, the inter-wafer moat trench 219 may have a tubular volume, and may divide each of the ILD layers 30 into a respective inner dielectric material portion and an annular outer dielectric material portion. Accordingly, each of the at least one low-k dielectric material layer (comprising at least one of, and/or all of, the ILD layers 30) may be divided into a respective inner low-k dielectric material portion located inside the inter-wafer moat trench 219 and a respective outer low-k dielectric material portion located outside the inter-wafer moat trench 219. Each patterned portion of the ILD layers 30 includes a cylindrical sidewall that is physically exposed to the inter-wafer moat trench 219. The etch mask layer 207 may be subsequently removed. Mechanical processing (such as scraping), chemical processing (such as dissolving in a solvent), ashing, or a combination thereof may be used to remove the etch mask layer 207 selective to the second semiconductor substrate 208.

Generally speaking, the inter-wafer moat trench 219 can be formed by a etch process employing an anisotropic etch process employing a reactive ion etching or employing a laser etch process. For example, a dry grooving process may be performed to form the inter-wafer moat trench 219. The dry grooving process may use a combination of the etch mask layer 207 and the anisotropic etch process. However, the methods of the present disclosure may be practiced by using alternative methods for forming the inter-wafer moat trench 219 in lieu of the dry grooving approach. For example, laser grooving may be used instead of the dry grooving method. In embodiments in which laser grooving is used, the width of the inter-wafer moat trench 219 may be in a range from 10 microns to 200 microns. Laser grooving directly evaporates various types of materials from eradiated regions, and precise control of the depth of the inter-wafer moat trench 219 may be possible by adjusting the power level and duration of laser irradiation. In embodiments in which laser grooving is used, an etch mask layer may not be necessary. The laser grooving may directly trim the first wafer 100 and the second wafer 200 without using the etch mask layer 207. Thus, the inter-wafer moat trench 219 may be etched into the through the entire thickness of the second semiconductor substrate 208 and into a proximal portion of the first semiconductor substrate 108. The power and duration of the laser beam may be adjusted such that the inter-wafer moat trench 219 vertically extends into a proximal portion of the first wafer at least by 1 micron, such as from 1 micron to 20 microns, and/or from 2 microns to 10 microns. In one embodiment, the depth by which the inter-wafer moat trench 219 extends into the proximal portion of the first wafer 100 may exceed that total thickness of semiconductor devices and metal interconnect structures within the first wafer 100.

Figure 4B:
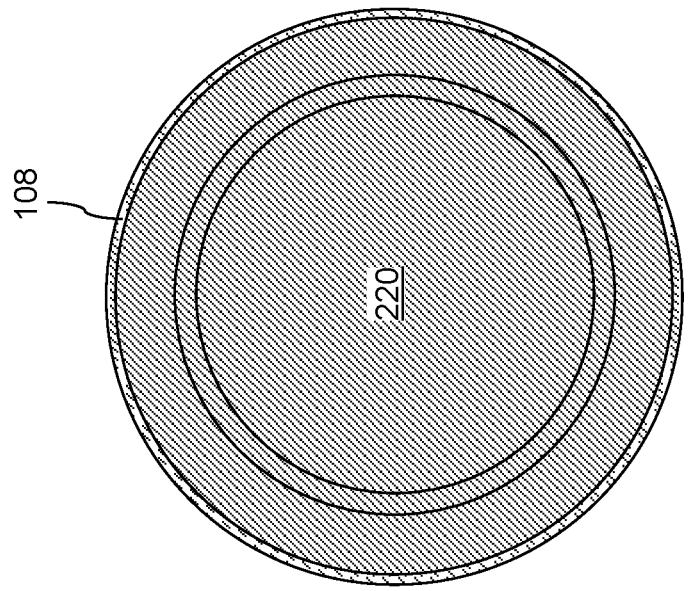
FIG. 4B is a top-down view of the exemplary structure of FIG. 4A.
Figure 4A:
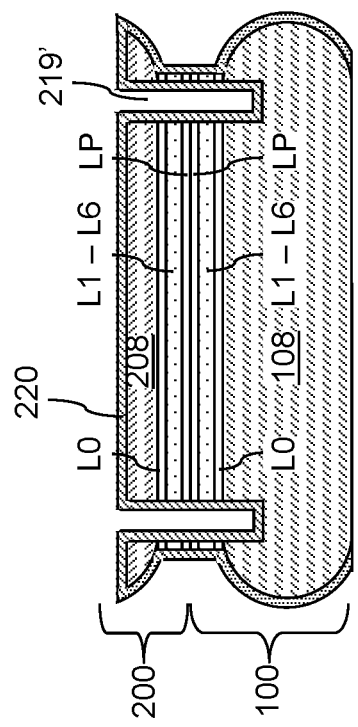
FIG. 4A is a vertical cross-sectional view of the exemplary structure after formation of a protective material layer according to an embodiment of the present disclosure.

Referring to FIGS. 4A and 4B, a protective material layer 220 may be formed in the inter-wafer moat trench 219 and over the backside surface of the second semiconductor substrate 208. The protective material layer 220 may be formed on physically exposed sidewalls of the at least one low-k dielectric material layer in the ILD layers 30. The protective material layer 220 includes at least one material that may provide protection to the low-k dielectric material(s) in the ILD layers 30 during subsequent processing steps by covering the physically exposed surfaces of the low-k dielectric material(s) in the ILD layers 30. The protective material layer 220 may be formed on sidewalls of each inner low-k dielectric material portion and each outer low-k dielectric material portion. In embodiments in which a first low-k dielectric material layers are present in the first wafer 100 and second low-k dielectric material layers are present in the second wafer 200, the protective material layer 220 may be formed on each of the first low-k dielectric material layers and on each of the second low-k dielectric material layers.

The protective material layer 220 may include a single material layer or a stack of multiple material layers. In one embodiment, the protective material layer 220 may include at least one material selected from a semiconductor material and a dielectric material (such as a non-porous dielectric material). In an embodiment, the protective material layer 220 includes a semiconductor material, amorphous silicon, polysilicon, and/or a silicon-germanium alloy for the entirety of, or for a portion of, the protective material layer 220. In another embodiment, the protective material layer 220 includes a dielectric material, silicon nitride and/or a dielectric metal oxide (such as aluminum oxide, hafnium oxide, tantalum oxide, titanium oxide, etc.) for the entirety of, or for a portion of, the protective material layer 220.

The protective material layer 220 partially or completely fills the inter-wafer moat trench 219. In one embodiment, the protective material layer 220 may be formed by a conformal deposition process such as chemical vapor deposition process (e.g., plasma-enhanced chemical vapor deposition or low pressure chemical vapor deposition). The protective material layer 220 may have a thickness that is less than one half of the width of the inter-wafer moat trench 219. In an embodiment, the protective material layer 220 partially fills the inter-wafer moat trench 219, and a moat cavity 219' that is not filled with the protective material layer 220 may be present within the inter-wafer moat trench 219. A moat cavity 219' has a generally cylindrical configuration. In an illustrative example, the protective material layer 220 may have a thickness in a range from 0.5 micron to 5 microns, although lesser and greater thicknesses may also be used.

Figure 5A:
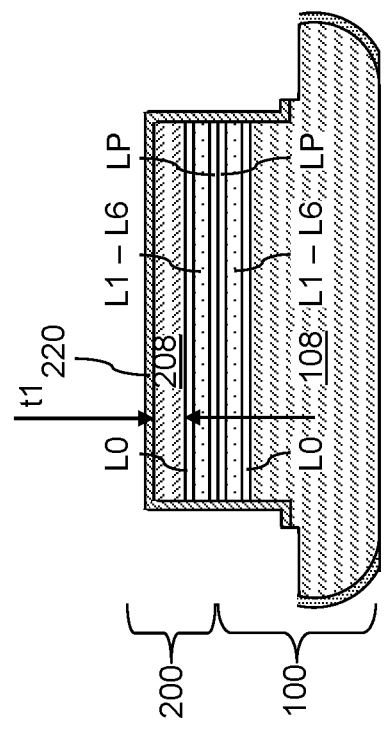
FIG. 5A is a vertical cross-sectional view of the exemplary structure after formation of blade-trimming a peripheral portion of the bonded assembly according to an embodiment of the present disclosure.
Figure 5B:
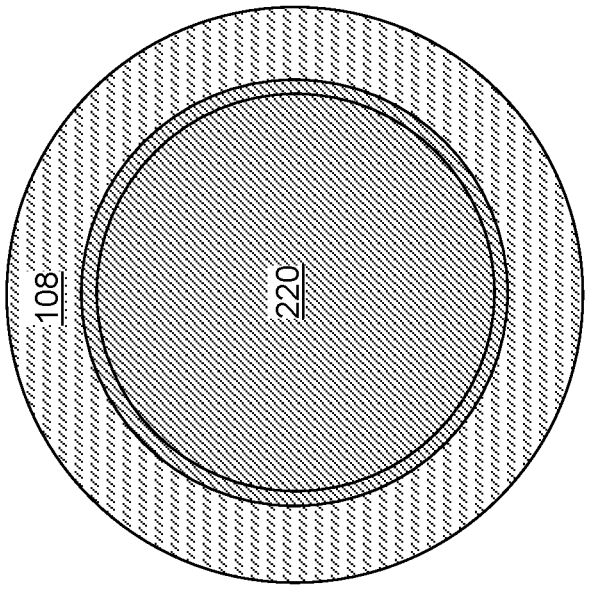
FIG. 5B is a top-down view of the exemplary structure of FIG. 5A.

Referring to FIGS. 5A and 5B, a peripheral portion of the bonded assembly (100, 200) located outside the inter-wafer moat trench 219 may be subsequently removed. In one embodiment, a blade-trimming process may be performed in which the peripheral portion of the second semiconductor substrate 208 is cut off by a rotating blade. The rotating blade may have one or more cutting edges, each of which may be substantially vertical. Further, the rotating blade may have at least one horizontal cutting edge. The bonded assembly (100, 200) and the rotating blade may be positioned such that the vertical cutting edge(s) of the rotating blade gradually move(s) inward from the periphery of the bonded assembly (100, 200) toward the vertical axis including the geometrical center of the bonded assembly (100, 200) until the vertical cutting edge(s) of the rotating blade is/are positioned about midway between the inner sidewall and the outer sidewall of the inter-wafer moat trench 219. All material portions of the bonded assembly (100, 200) located outside the outer sidewall of the inter-wafer moat trench 219 may be removed by the blade-trimming process. The at least one horizontal cutting edge of the rotating blade may be positioned at a horizontal plane located below the annular bottom surface of the inter-wafer moat trench 219. Thus, an annular horizontal surface of the first semiconductor substrate 108 may be physically exposed after the blade-trimming process. In one embodiment, the at least one horizontal cutting edge and the vertical cutting edge(s) may be integrated into a single cutting edge.

Remaining portions of the protective material layer 220 after the blade-trimming process includes a horizontal portion of the protective material layer 220 that contact the backside surface of the second semiconductor substrate 208 and a cylindrical portion that laterally surrounds a remaining portion (i.e., the inner portion) of each of the at least one low-k dielectric layer within the ILD layers 30 of the first wafer 100 and the second wafer 200. Because of the inter-wafer moat trench 219, the inner portion (central portion) of the bonded assembly (100, 200) located inside the inter-wafer moat trench 219 may be free from a direct contact of the blade-trimming, and the inner portion of the bonded assembly (100, 200) may be protected from the mechanical stress of the blade.

Generally, removal of a peripheral portion of the bonded assembly (100, 200) after a grinding process that thins a semiconductor substrate (such as the process of FIGS. 2A and 2B) may increase the yield of a wafer thinning process by preventing chipping of the thinned semiconductor substrate. Peripheral portions of a wafer that do not include product semiconductor dies may be trimmed during a wafer thinning process to prevent the bonded wafer assembly from peeling. However, the trimming process typically removes all layers of the trimmed wafer, thereby physically exposing sidewalls of various material layers of the trimmed wafer to the ambient environment. Moisture ingress or surface contamination may occur in some of the physically exposed material layers. Such moisture ingress and surface contamination may compromise the reliability of semiconductor chips located at the edge regions of the thinned wafer. Typically, the most fragile part during the wafer thinning process is the wafer edge formed after the grinding process, which has a sharp knife edge due to the convex edge surfaces provided in the second semiconductor substrate 208 prior to thinning. Such a sharp knife edge may cause chipping, thereby generating macroscopic semiconductor particles and/or wafer breakage. The blade-trimming process may adapt any diamond blade dicing technique with a modification to the shape of the rotating blade to optimize the cutting efficiency.

The cylindrical portion of the protective material layer 220 laterally surrounds an upper region of a remaining portion of the bonded assembly (100, 200). The upper region of a remaining portion of the bonded assembly (100, 200) may include all regions of the bonded assembly (100, 200) including the first and second semiconductor devices of the first and second wafers (100, 200), all of the interconnect-level structures (L0-L6) and the pad-level structures LP, and the entirety of the second semiconductor substrate 208.

The cylindrical portion of the protective material layer 220 laterally surrounds and contacts each of the first interconnect-level dielectric layers in the first wafer 100 and each of the second interconnect-level dielectric layers in the second wafer 200. Each of the first interconnect-level dielectric layers in the first wafer 100 and each of the second interconnect-level dielectric layers in the second wafer 200 are inner portions of the interconnect-level dielectric layers 30 located inside the inter-wafer moat trench 219 as formed at the processing steps of FIGS. 3A and 3B. Each outer portion of the interconnect-level dielectric layers 30, including each outer low-k dielectric material portion, may be removed while the peripheral portion of the second semiconductor substrate 208 is blade-trimmed. The cylindrical portion of the protective material layer 220 protect the inner portions of the interconnect-level dielectric layers 30 (including inner portions of the at least one low-k dielectric material layer) located inside the inter-wafer moat trench 219 from mechanical particles and from structural damage during removal of the peripheral portion of the bonded assembly (100, 200) located outside the inter-wafer moat trench 219.

Referring to FIGS. 6A and 6B, the horizontal portion of the protective material layer 220 and a second backside portion of the second semiconductor substrate 208 may be removed by performing at least one thinning process. The at least one thinning process may use a grinding process, a dry etch process, a chemical mechanical planarization process, and a wet etch process. For example, a fine-grinding process using a grind wheel with an extremely fine diamond grit may be performed to thin the second semiconductor substrate 208 to remove the horizontal portion of the protective material layer 220 and the second backside portion of the second semiconductor substrate 208. The second semiconductor substrate 208 may be thinned to an intermediate thickness tm, which may be in a range from 1 microns to 30 microns, such as from 3 microns to 15 microns. The cylindrical portion of the protective material layer 220 protects the remaining portions of the interconnect-level dielectric layers 30, which include the at least one low-k dielectric layer. Thus, structural damage and/or contamination of the at least one low-k dielectric layer within the interconnect-level dielectric layers 30 may be prevented by the cylindrical portion of the protective material layer 220 during the at least one thinning process. The cylindrical portion of the protective material layer 220 is hereafter referred to as a cylindrical protective material layer 222.

Figure 7B:
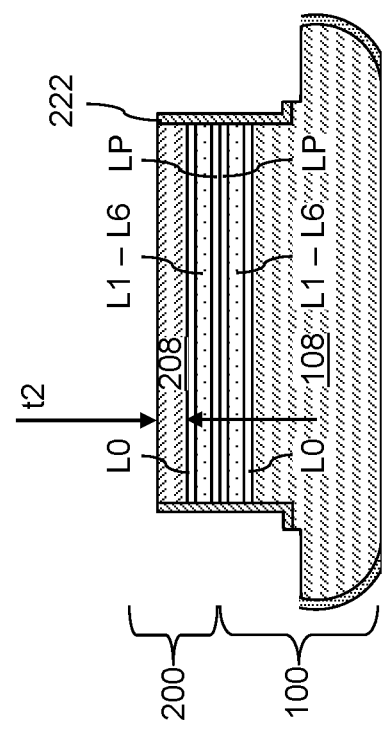
FIG. 7B is a top-down view of the exemplary structure of FIG. 7A.
Figure 7A:
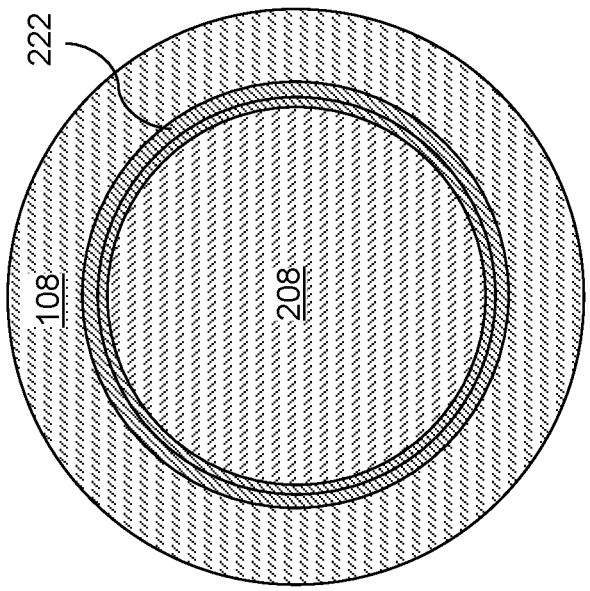
FIG. 7A is a vertical cross-sectional view of the exemplary structure after removing an additional backside portion of the second semiconductor substrate by performing at least one additional thinning process according to an embodiment of the present disclosure.

Referring to FIGS. 7A and 7B, a third backside portion of the second semiconductor substrate 208 may be removed by performing at least one additional thinning process. The at least one additional thinning process may use a grinding process, a dry etch process, a chemical mechanical planarization process, and a wet etch process. For example, a dry etch process that etches the semiconductor material of the second semiconductor substrate 208 may be performed, followed by a surface clean process (such as a wet clean process using deionized water, hydrogen peroxide, and/or isopropyl alcohol). A chemical mechanical planarization process may be subsequently performed to provide a polished surface on the backside of the second semiconductor substrate 208, followed by another surface clean process (such as a wet clean process). A wet etch process that etches the semiconductor material of the second semiconductor substrate 208 may be performed to further thin the second semiconductor substrate 208. For example, a wet etch process using tetramethyl ammonium hydroxide (TMAH) or hot trimethyl-2 hydroxyethyl ammonium hydroxide ("hot TMY") may be used to remove an additional backside portion of the second semiconductor substrate 208. The second semiconductor substrate 208 may be thinned to a second thickness t2, which may be in a range from 0.5 microns to 20 microns, such as from 1 micron to 10 microns. The cylindrical protective material layer 222 protects the remaining portions of the interconnect-level dielectric layers 30 (which include the at least one low-k dielectric layer) during each of the additional thinning processes. Thus, structural damage and/or contamination of the at least one low-k dielectric layer within the interconnect-level dielectric layers 30 may be prevented by the cylindrical protective material layer 222 during each of the additional thinning processes.

While present disclosure is described using an embodiment in which a fine-grinding process, a dry etch process, a chemical mechanical planarization process, and a wet etch process are sequentially performed, embodiments are expressly contemplated herein in which one or more of the above-described thinning processes are omitted, repeated, or performed out of order. Generally, at least one thinning process may be used to thin the second semiconductor substrate 208 to the second thickness t2. The at least one thinning process may comprise at least one process that is selected from a grinding process, a dry etch process, a chemical mechanical planarization process, and a wet etch process. The cylindrical protective material layer 222 protects the remaining portions of the interconnect-level dielectric layers 30 (which include the at least one low-k dielectric layer) during each of such additional thinning processes.

Figure 8B:
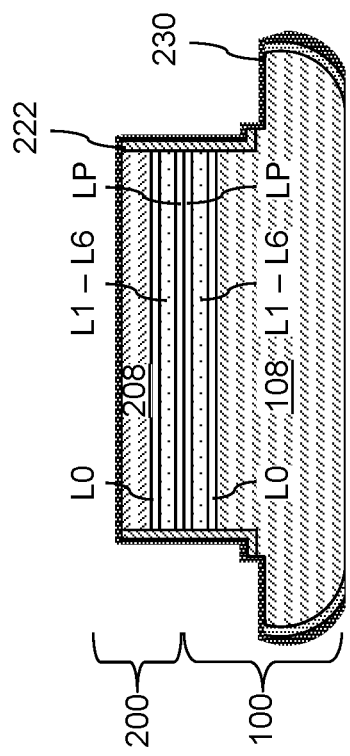
FIG. 8B is a top-down view of the exemplary structure of FIG. 8A.
Figure 8A:
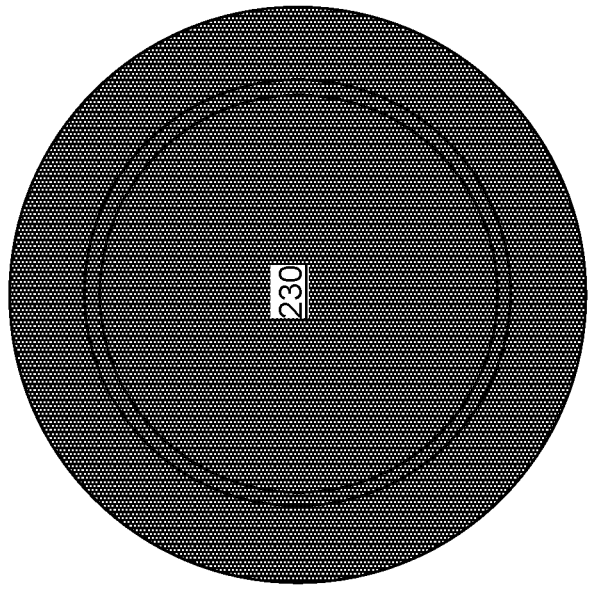
FIG. 8A is a vertical cross-sectional view of the exemplary structure after formation of an encapsulation dielectric layer according to an embodiment of the present disclosure.

Referring to FIGS. 8A and 8B, an encapsulation dielectric layer 230 may be subsequently formed on the physically exposed surfaces of the bonded assembly (100, 200). The encapsulation dielectric layer 230 may be formed on the physically exposed surfaces of the cylindrical protective material layer 222. The encapsulation dielectric layer 230 may include a dielectric material that may protect the bonded assembly (100, 200) during a subsequent singulation process in which each die within the bonded assembly (100, 200) is singulated into a discrete structure. The encapsulation dielectric layer 230 may include silicon nitride or a high dielectric constant (high-k) dielectric material having a dielectric constant greater than 7.9 (such as aluminum oxide, hafnium oxide, tantalum oxide, titanium oxide, etc.). The thickness of the encapsulation electric layer 230 may be in a range from 50 nm to 500 nm, although lesser and greater thicknesses may also be used.

Figure 9:
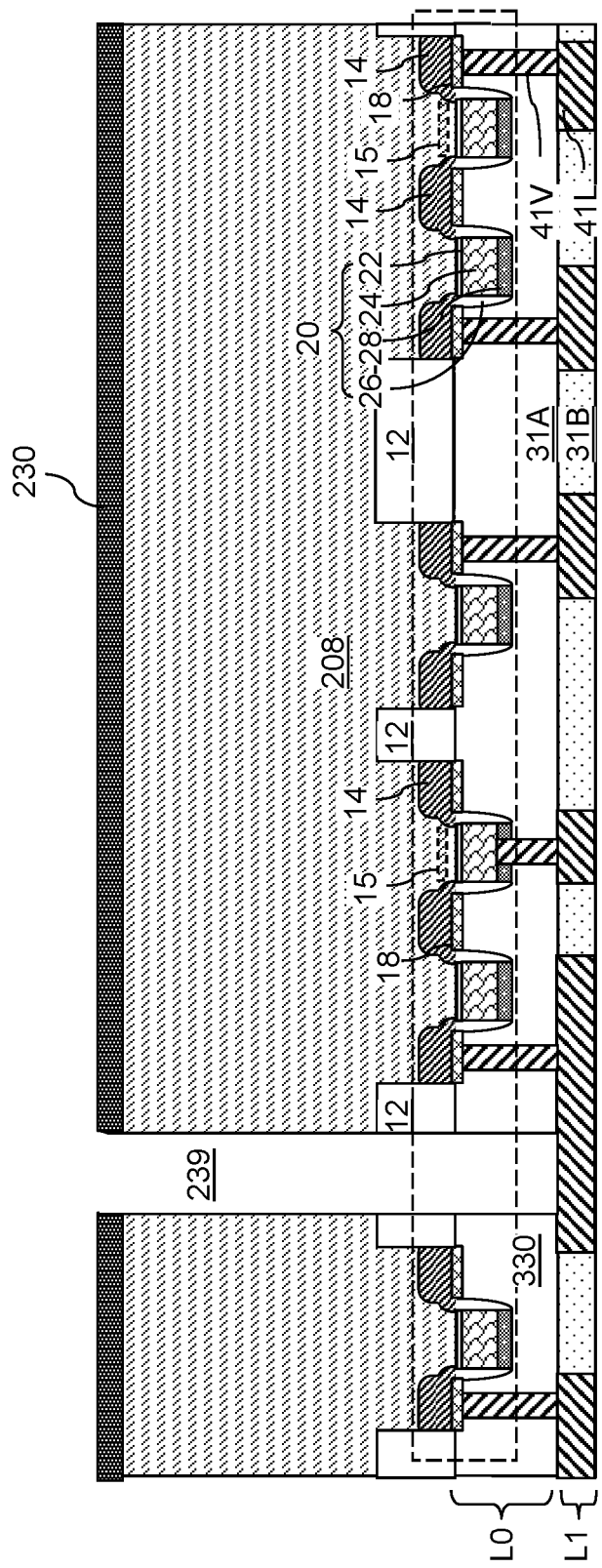
FIG. 9 is a zoom-in vertical cross-sectional view of the exemplary structure after formation of through-substrate via cavities according to an embodiment of the present disclosure.

Referring to FIG. 9, an upper portion of the exemplary structure is illustrated in a magnified view. A photoresist layer (not shown) may be applied over the horizontal portion of the encapsulation dielectric layer 230 that overlie the second semiconductor substrate 208, and may be lithographically patterned to form openings therethrough. An anisotropic etch process may be performed to etch through unmasked portions of the encapsulation dielectric layer 230, the second semiconductor substrate 208, and a subset of the interconnect-level dielectric layers 30 such that a horizontal surface of an underlying metallic pad structure is physically exposed. The metallic pad structures may comprise one of the metal lines of the second wafer 200 (such as the first metal lines 41L, the second metal lines 42L, the third metal lines 43L, etc.). Through-substrate via cavities 239 may be formed through the second semiconductor substrate 208 within each die area of the second wafer 200.

Figure 10:
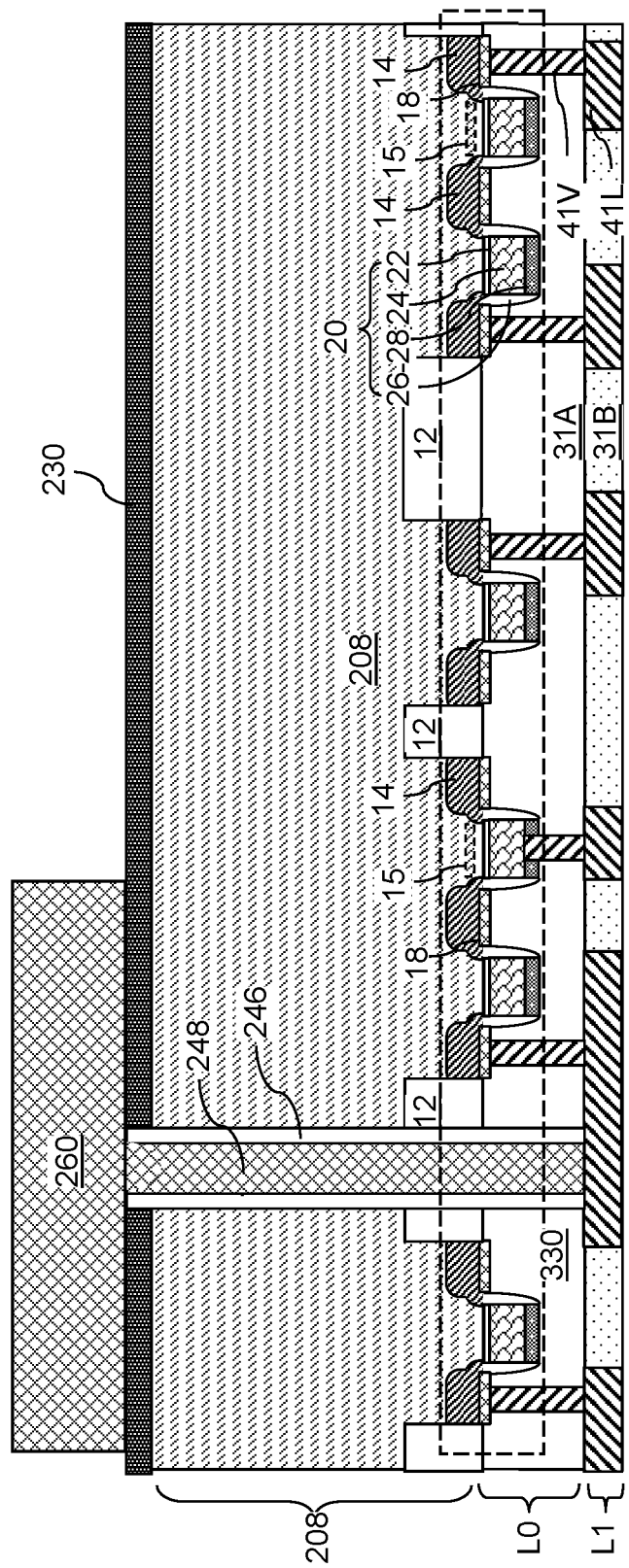
FIG. 10 is a zoom-in vertical cross-sectional view of the exemplary structure after formation of through-substrate via structures and backside bonding pads according to an embodiment of the present disclosure.

Referring to FIG. 10, a dielectric material such as silicon oxide may be conformally deposited, and may be subsequently anisotropically etched to form through-substrate insulating spacers 246. The lateral thickness of each through-substrate insulating spacer 246 may be in a range from 100 nm to 500 nm, although lesser and greater thicknesses may also be used. At least one conductive material may be deposited in the through-substrate via cavities 239 and over the top surface of the encapsulation dielectric layer 230. For example, a metallic liner material (such as TiN, TaN, and/or WN) and at least one metallic fill material (such as Cu, Mo, Ru, W, Al, or a combination thereof) may be deposited in remaining volumes of the through-substrate via cavities 239 and over the top surface of the encapsulation dielectric layer 230. The at least one metallic fill material may fill the through-substrate via cavities 239. An under-bump metallurgy (UBM) layer stack may be deposited over the at least one metallic fill material. Layer stacks that may be used for the UBM layer stack include, but are not limited to, stacks of Cr/Cr-Cu/Cu/Au, Cr/Cr-Cu/Cu, TiW/Cr/Cu, Ti/Ni/Au, and Cr/Cu/Au. Other suitable materials are within the contemplated scope of disclosure.

The UBM layer stack and the at least one conductive material may be subsequently patterned, for example, by applying and patterning a photoresist layer and by transferring the pattern in the photoresist layer through the horizontal portions of the UBM layer stack and the at least one conductive material. Each remaining portion of the at least one conductive material located within a respective one of the through-substrate via cavities 239 constitutes a through-substrate via structure 248. Each remaining portion of the at least one conductive material and the UBM layer stack that overlie the horizontal plane including the distal horizontal surface of the encapsulation dielectric layer 230 comprises a bonding pad 260, which may be an external bonding pad on which a solder ball may be attached for wire bonding or C4 bonding. In an alternative embodiment, the UBM layer stack may be omitted and the at least one conductive material may include copper or a copper alloy as a metallic fill material. In such an embodiment, the bonding pads 260 may have a copper surface that may be subsequently used for copper-to-copper bonding with copper bonding pads formed within another wafer in a subsequent wafer-to-wafer bonding process that forms a bonded assembly of three wafers.

Referring to FIGS. 11A and 11B, the exemplary structure includes a bonded assembly (100, 200) comprising a first wafer 100 bonded to a second wafer 200 at a bonding interface. A straight cylindrical sidewall may vertically extend from a backside surface of the second wafer 200 over a periphery of the bonding interface to a peripheral region of the first wafer 100. A cylindrical protective material layer 222 contacts an entirety of the straight cylindrical sidewall, and laterally encloses the second wafer 200, the bonding interface, and a proximal portion of the first wafer 100. At least one low-k dielectric material layer including a dielectric material having a dielectric constant less than 3.9 may be located between a first semiconductor substrate 108 of the first wafer 100 and a second semiconductor substrate 208 of the second wafer 200. The cylindrical protective material layer 222 laterally surrounds and contacts each of the at least one low-k dielectric material layer, which are located within the interconnect-level dielectric layers 30 of the first wafer 100 and the second wafer 200.

In some embodiments, additional bonding with another wafer is not performed, the bonded assembly (100, 200) may be diced to singulate semiconductor chips 300. For example, the bonded assembly (100, 200) may be diced with a dicing saw along dicing channels DC. The dicing channels DC may include first dicing channels that are parallel to one another and laterally extend along a first horizontal direction, and second dicing channels that are parallel to one another and laterally extend along a second horizontal direction that is perpendicular to the first horizontal direction. Each of the dicing channels DC may be located between neighboring pairs of semiconductor dies within the first wafer 100 and between neighboring pairs of semiconductor dies within the second wafer.

Each semiconductor chip 300 that is singulated by the dicing process may include a first semiconductor die that is a singulated portion of the first wafer 100 and a second semiconductor die that is a singulated portion of the second wafer 200. As such, each semiconductor chip 300 may include a stack of a first semiconductor die and a second semiconductor die that are bonded to each other through metal-to-metal bonding between first bonding pads in a first pad-level dielectric layer of the first semiconductor die and second bonding pads in a second pad-level dielectric layer of the second semiconductor die. Additional bonding pads 260, which may be external bonding pads including a respective UBM layer stack, may be provided on the backside of the second semiconductor die. Peripheral diced units including a respective remaining portion of the cylindrical protective material layer 222 may be discarded.

Referring to FIGS. 12A and 12B, a first alternative configuration of the exemplary structure is illustrated after formation of a protective material layer 220. In the alternative configuration, the thickness of the protective material layer 220 may be increased such that a cylindrical plug portion 221 of the protective material layer 220 blocks at least the upper portion of the inter-wafer moat trench 219 at a level of backside surface of the second semiconductor substrate 208, i.e., at the height of the backside surface of the second semiconductor substrate 208. In one embodiment, the protective material layer 220 may be deposited conformally in the inter-wafer moat trench 219, and the cylindrical plug portion 221 may be free of any cavity therein. In another embodiment, the protective material layer 220 may be deposited non-conformally in the inter-wafer moat trench 219 such that a vertically-elongated toroidal encapsulated cavity (not expressly illustrated) may be formed within the cylindrical plug portion 221.

Figure 13B:
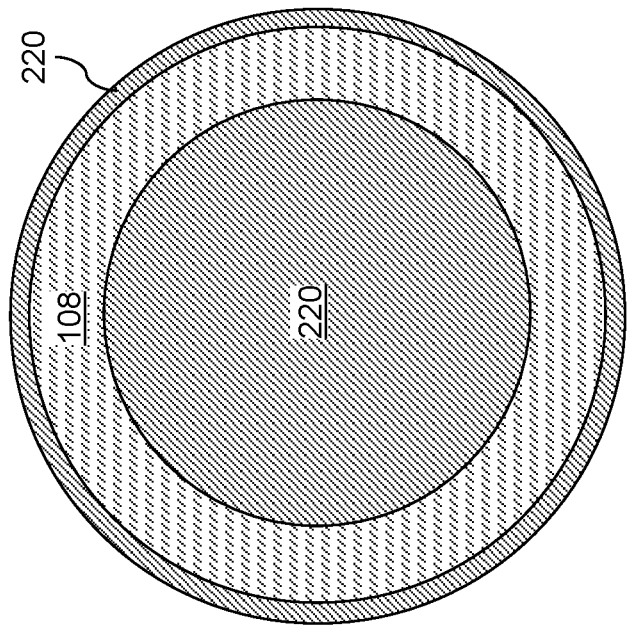
FIG. 13B is a top-down view of the first alternative configuration of the exemplary structure of FIG. 13A.
Figure 13A:
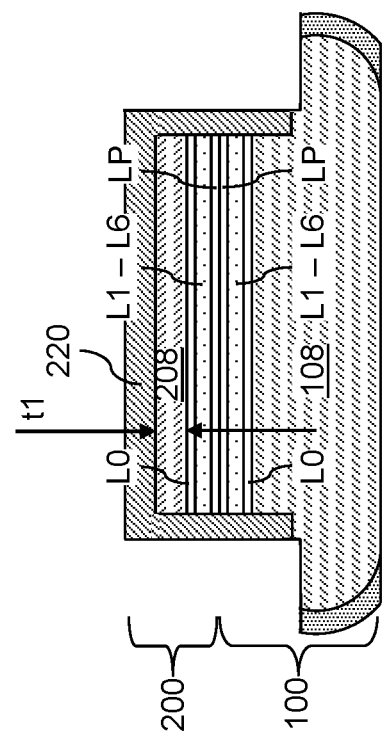
FIG. 13A is a vertical cross-sectional view of the first alternative configuration of the exemplary structure after formation of blade-trimming a peripheral portion of the bonded assembly according to an embodiment of the present disclosure.

Referring to FIGS. 13A and 13B, the processing steps of FIGS. 5A and 5B may be performed to remove a peripheral portion of the bonded assembly (100, 200) located outside the inter-wafer moat trench 219. In one embodiment, a blade-trimming process may be performed in which the peripheral portion of the second semiconductor substrate is cut off by a rotating blade. In one embodiment, a remaining portion of the protective material layer 220 may include a straight cylindrical sidewall located outside the cylindrical interface between the vertically coincident sidewalls of the second semiconductor substrate 208, the interconnect-level structures (L0-L6), the pad-level structures LP, and an upper portion of the first semiconductor substrate 108.

Referring to FIGS. 14A and 14B, the processing steps of FIGS. 6A and 6B, 7A and 7B, 8A and 8B, 9, 10, and 11A and 11B may be subsequently performed. The bonded assembly of FIGS. 14A and 14B may be diced by performing the processing steps of FIGS. 11A and 11B. Alternatively, the bonding pads 260 may be formed as metal bonding pads (such as copper pads), and a third wafer (not illustrated) may be bonded to the bonded assembly (100, 200) of the first wafer 100 and the second wafer 200, and the processing steps described above may be performed on the third wafer to thin the third wafer.

Figure 15B:
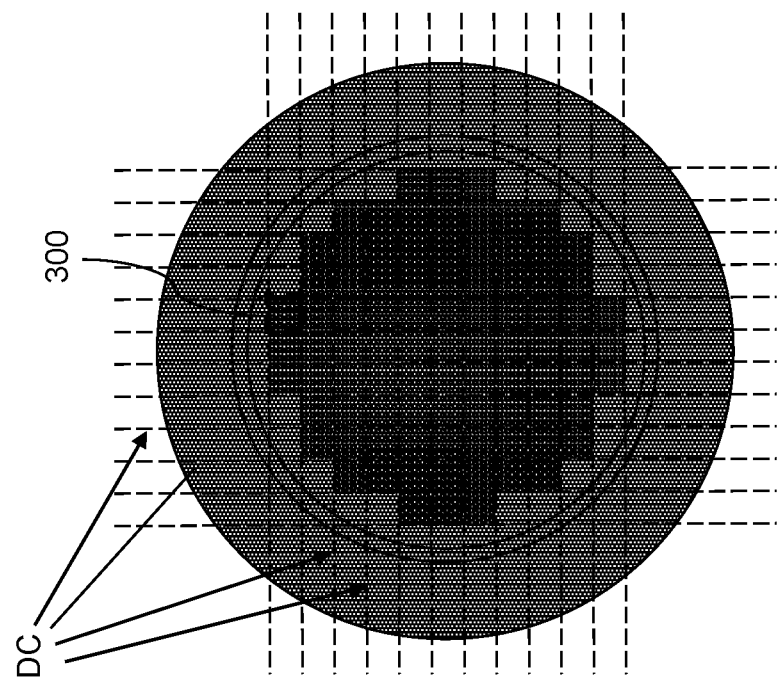
FIG. 15B is a top-down view of the second alternative configuration of the exemplary structure of FIG. 15A.
Figure 15A:
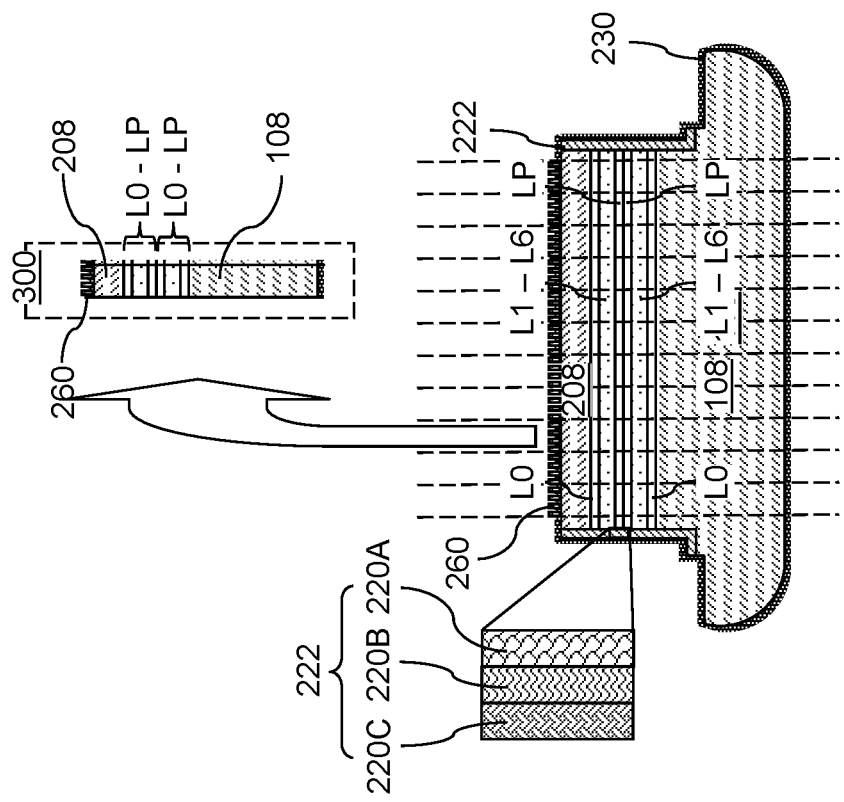
FIG. 15A is a vertical cross-sectional view of a second alternative configuration of the exemplary structure at the processing step of die singulation according to an embodiment of the present disclosure.

Referring to FIGS. 15A and 15B, another configuration of the exemplary structure is illustrated at the processing step of die singulation. This configuration of the exemplary structure may be derived from the exemplary structure of FIGS. 11A and 11B or from the alternative configuration illustrated in FIGS. 14A and 14B by using a plurality of protective material sublayers (220A, 220B, 220C) for the protective material layer. Thus, the cylindrical protective material layer 222 includes a plurality of protective material sublayers (220A, 220B, 220C). For example, a first protective material sublayer 220A, a second protective material sublayer 220B, and a third protective material sublayer 220C may be sequentially deposited. The plurality of protective material sublayers (220A, 220B, 220C) may have different material compositions to protect the at least one low-k dielectric material in the interconnect-level dielectric (ILD) layers 30 of the first wafer 100 and the second wafer 200. In an illustrative example, the first protective material sublayer 220A may include polysilicon, the second protective material sublayer 220B may include silicon nitride or a dielectric metal oxide material, and the third protective material sublayer 220C may include polysilicon. In another illustrative example, the plurality of protective material sublayers (220A, 220B, 220C) may include silicon materials that are deposited by different deposition methods such as chemical vapor deposition and physical vapor deposition, and/or a polycrystalline material deposition process, an amorphous material deposition process, and/or an epitaxial material deposition process. In yet another illustrative example, the plurality of protective material sublayers (220A, 220B, 220C) may include silicon materials having different doping type and/or different dopant concentrations that provide different etch resistance in wet silicon etch process. For example, a doped semiconductor material is more etch-resistant than an undoped semiconductor material in a wet etch process using tetramethyl ammonium hydroxide (TMAH) or hot trimethyl-2 hydroxyethyl ammonium hydroxide ("hot TMY"). The plurality of protective material sublayers (220A, 220B, 220C) may be used as an endpoint layer or a stopping layer during subsequent thinning processes.

Figure 16:
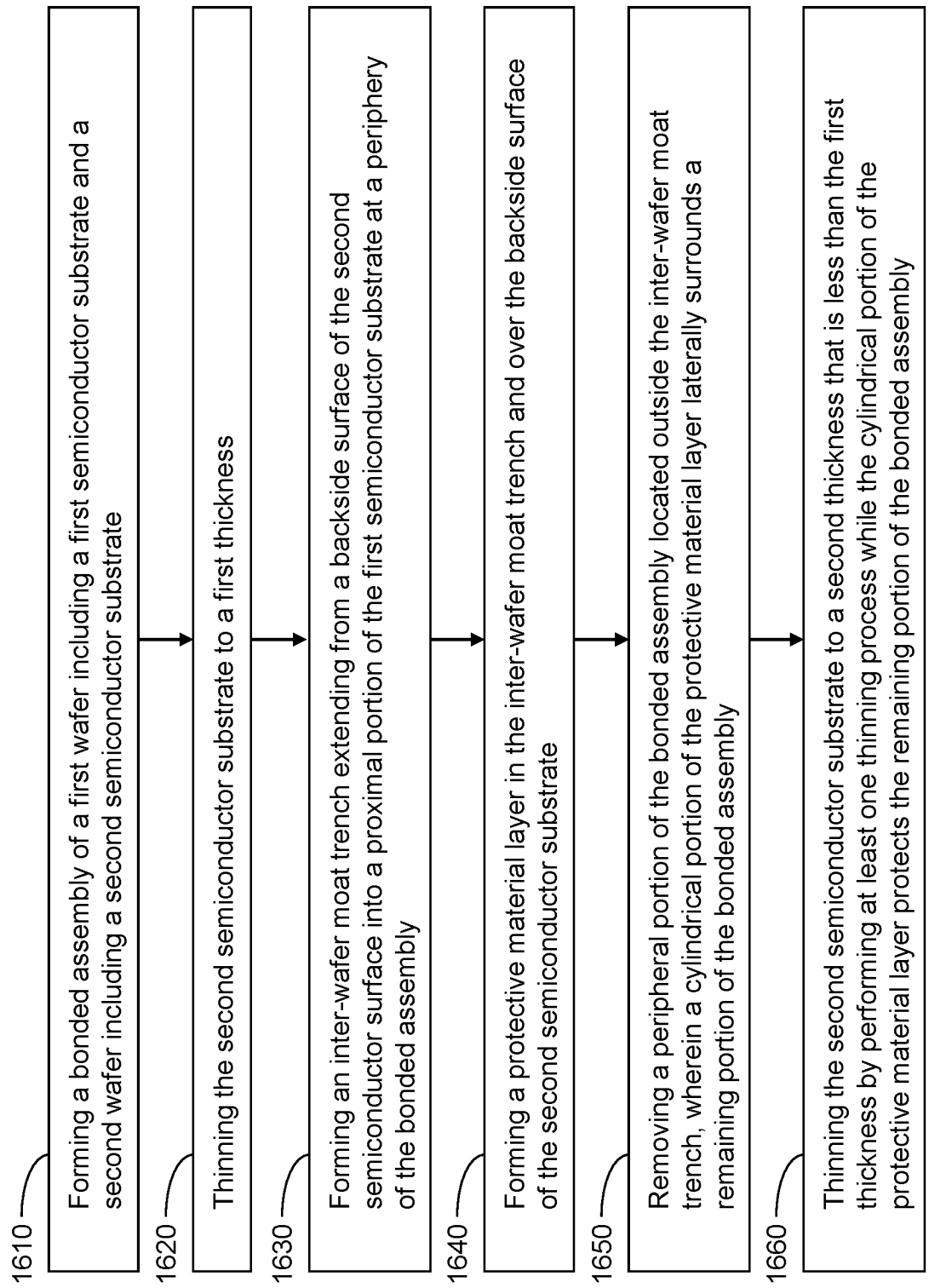
FIG. 16 is a first flowchart illustrating steps for thinning a bonded structure including a first wafer and a second wafer according to an embodiment of the present disclosure.

Referring to FIG. 16, a first flowchart illustrates steps for thinning a bonded structure including a first wafer 100 and a second wafer 200. The steps in the first flow chart are described with reference to the processing steps described above. Referring to step 1610, a bonded assembly of a first wafer 100 including a first semiconductor substrate 108 and a second wafer 200 including a second semiconductor substrate 208 may be formed. Referring to step 1620, the second semiconductor substrate 208 may be thinned to a first thickness t1, for example, by grinding. Referring to step 1630, an inter-wafer moat trench 219 extending from a backside surface of the second semiconductor substrate 208 into a proximal portion of the first semiconductor substrate 108 may be formed at a periphery of the bonded assembly (100, 200). Referring to step 1640, a protective material layer 220 may be formed in the inter-wafer moat trench 219 and over the backside surface of the second semiconductor substrate 208. Referring to step 1650, a peripheral portion of the bonded assembly (100, 200) located outside the inter-wafer moat trench 219 may be removed. A cylindrical portion of the protective material layer 220 laterally surrounds a remaining portion of the bonded assembly (100, 200). Referring to step 1660, the second semiconductor substrate 208 may be thinned to a second thickness t2 that is less than the first thickness t1 by performing at least one thinning process while the cylindrical portion of the protective material layer 220 protects the remaining portion of the bonded assembly (100, 200), and particularly at least one low-k dielectric layer within the interconnect-level dielectric layers 30.

Figure 17:
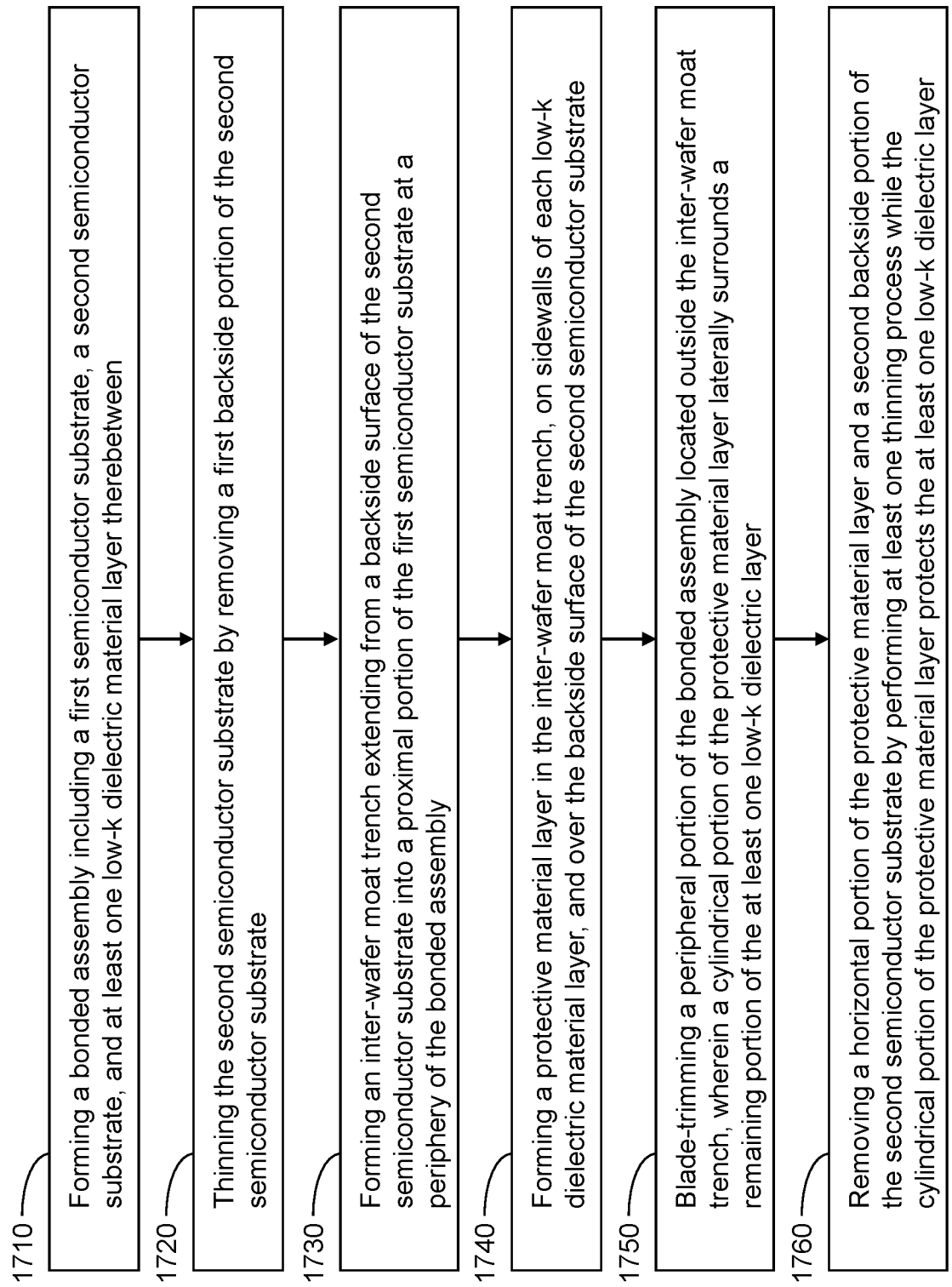
FIG. 17 is a second flowchart illustrating steps for thinning a bonded structure including a first wafer and a second wafer according to an embodiment of the present disclosure.

Referring to FIG. 17, a second flowchart illustrates steps for thinning a bonded structure including a first wafer 100 and a second wafer 200. The steps in the second flow chart are described with reference to the processing steps described above. Referring to step 1710, a bonded assembly (100, 200) of a first wafer 100 including a first semiconductor substrate 108 and a second wafer 200 including a second semiconductor substrate 208 is formed. At least one low-k dielectric material layer including a dielectric material having a dielectric constant less than 3.9 is located between the first semiconductor substrate 108 and the second semiconductor substrate 208. Referring to step 1720, the second semiconductor substrate 208 may be thinned by removing a first backside portion of the second semiconductor substrate 208. Referring to step 1730, an inter-wafer moat trench 219 extending from a backside surface of the second semiconductor substrate 208 into a proximal portion of the first semiconductor substrate 108 may be formed at a periphery of the bonded assembly (100, 200). Referring to step 1740, a protective material layer 220 may be formed in the inter-wafer moat trench 219, on sidewalls of the at least one low-k dielectric material layer, and over the backside surface of the second semiconductor substrate 208. Referring to step 1750, a peripheral portion of the bonded assembly (100, 200) located outside the inter-wafer moat trench 219 may be blade-trimmed. A cylindrical portion of the protective material layer 220 laterally surrounds a remaining portion of the at least one low-k dielectric layer. Referring to step 1760, a horizontal portion of the protective material layer 220 and a second backside portion of the second semiconductor substrate 208 may be removed by performing at least one thinning process while the cylindrical portion of the protective material layer 220 protects the remaining portion of the at least one low-k dielectric layer. Each step of the second flow chart may use a same processing step as a corresponding step of the first flow chart, and vice versa. Thus, the processing steps of the second flow chart may be performed concurrently with the processing steps of the first flow chart.

Referring to FIG. 18, a first flowchart illustrates steps for thinning a bonded structure including a first wafer 100 and a second wafer 200. The steps in the first flow chart are described with reference to the processing steps described above. Referring to step 1810, a bonded assembly of a first wafer 100 including a first semiconductor substrate 108 and a second wafer 200 including a second semiconductor substrate 208 may be formed. Referring to step 1820, the second semiconductor substrate 208 may be thinned to a first thickness t1, for example, by grinding. Referring to step 1830, the bonded assembly may be irradiated with a laser to form an inter-wafer moat trench 219 extending from a backside surface of the second semiconductor substrate 208 into a proximal portion of the first semiconductor substrate 108 at a periphery of the bonded assembly (100, 200). Referring to step 1840, a protective material layer 220 may be formed in the inter-wafer moat trench 219 and over the backside surface of the second semiconductor substrate 208. Referring to step 1850, a peripheral portion of the bonded assembly (100, 200) located outside the inter-wafer moat trench 219 may be removed. A cylindrical portion of the protective material layer 220 laterally surrounds a remaining portion of the bonded assembly (100, 200). Referring to step 1860, a horizontal portion of the protective material layer 220 and a second backside portion of the second semiconductor substrate 208 may be removed by performing at least one thinning process while the cylindrical portion of the protective material layer 220 protects the remaining portion of the bonded assembly.

Referring to all drawings and according to various embodiments of the present disclosure, a method for forming a semiconductor structure is provided, wherein the method includes the operations of forming a bonded assembly (100, 200) of a first wafer 100 including a first semiconductor substrate 108 and a second wafer 200 including a second semiconductor substrate 208. The method further including the operation of thinning the second semiconductor substrate 208 to a first thickness. The method further including the operation etching a trench 219 extending from a backside surface of the second semiconductor surface 208 into a proximal portion of the first semiconductor substrate 108 at a periphery of the bonded assembly. The method further including the operation removing a peripheral portion of the bonded assembly located outside the trench 219. The method further including the operation thinning the second semiconductor substrate 208 to a second thickness that is less than the first thickness after removing the peripheral portion of the bonded assembly.

In another embodiment, a method for forming a semiconductor structure is provided, wherein the method includes the operations of forming a bonded assembly (100, 200) of a first wafer 100 including a first semiconductor substrate 108 and a second wafer 200 including a second semiconductor substrate 208. The method further including the operation of thinning the second semiconductor substrate 208 by removing a first backside portion of the second semiconductor substrate 208. The method further including the operation forming an inter-wafer moat trench 219 extending from a backside surface of the second semiconductor surface 208 into a proximal portion of the first semiconductor substrate 108 at a periphery of the bonded assembly (100, 200). The method further including the operation forming a protective material layer 220 in the inter-wafer moat trench 219, on sidewalls of the at least one material layer, and over the backside surface of the second semiconductor substrate 208. The method further including the operation performing at least one thinning process to remove a horizontal portion of the protective material layer 220 and a second backside portion of the second semiconductor substrate 208 while the cylindrical portion of the protective material layer 220 protects the remaining portion of the at least one material layer.

In an embodiment, a method of forming a semiconductor structure is provided wherein the method includes the operations of forming a bonded assembly (100, 200) of a first wafer 100 including a first semiconductor substrate 108 and a second wafer 200 including a second semiconductor substrate 208. The method also includes the operation of thinning the second semiconductor substrate 208 to a first thickness. The method further includes the operation of irradiating the bonded assembly (100, 200) with a laser beam to form a trench 219 extending from a backside surface of the second semiconductor surface 208 into a proximal portion of the first semiconductor substrate 108 at a periphery of the bonded assembly (100, 200). The method further including the operation of forming a protective material layer 220 in the trench 219 and over the backside surface of the second semiconductor substrate 208. The method further including the operation of removing a peripheral portion of the bonded assembly (100, 200) located outside the trench 219, wherein a cylindrical portion of the protective material layer laterally surrounds a remaining portion of the bonded assembly; and performing at least one thinning process to remove a horizontal portion of the protective material layer and a second backside portion of the second semiconductor substrate while the cylindrical portion of the protective material layer 220 protects the remaining portion of the bonded assembly (100, 200).

In an embodiment, a bonded assembly (100, 200) is provided comprising a first wafer 100 bonded to a second wafer 200 at a bonding interface, wherein: a straight cylindrical sidewall vertically extends from a backside surface of the second wafer 200 over a periphery of the bonding interface to a peripheral region of the first wafer 100; and a cylindrical protective material layer 220 contacts an entirety of the straight cylindrical sidewall and laterally encloses the second wafer 200, the bonding interface, and a proximal portion of the first wafer 100.

The various structures and methods of the present disclosure may be used to protect low-k dielectric materials in a bonded assembly (100, 200), such as extremely low-k (ELK) porous dielectric materials used in the interconnect-level dielectric (ILD) layers 30 of the first wafer 100 and/or the second wafer, during contamination and mechanical damage during a thinning process. The process yield of the thinning process may be enhanced through use of the inter-wafer moat cavity 219 and the protective material layer 220. The formation of the inter-wafer moat cavity 219 may protect a trim wall from mechanical force damage during a blade trimming process. The protective material layer 220 may prevent moisture ingress and surface contamination to the exposed material layers. Further, the process yield of the die singulation process may also be increased due to the presence of the cylindrical protective material layer 220 during the die singulation process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
 forming a plurality of first semiconductor devices on a first semiconductor substrate of a first wafer;
 forming a plurality of second semiconductor devices on a second semiconductor substrate of a second wafer;
 forming a bonded assembly of the first wafer including the first semiconductor substrate and the second wafer including the second semiconductor substrate; and
 removing a peripheral portion of the bonded assembly, wherein removing the peripheral portion of the bonded assembly further comprises:
  etching the bonded assembly to form an inter-wafer moat trench; and removing the peripheral portion of the bonded assembly located outside the inter-wafer moat trench.

2. The method of claim 1, further comprising:
forming a plurality of first metal interconnect structures within first interconnect-level dielectric layers of the first wafer such that the plurality of first metal interconnect structures are electrically connected to the plurality of first semiconductor devices; and
forming a plurality of second metal interconnect structures within second interconnect-level dielectric layers of the second wafer such that the plurality of second metal interconnect structures are electrically connected to the plurality of second semiconductor devices.

3. The method of claim 2, further comprising:
forming a plurality of first bonding pads within a first pad-level dielectric layer within the first wafer such that the plurality of first bonding pads are electrically connected to the plurality of first metal interconnect structures; and
forming a plurality of second bonding pads within a second pad-level dielectric layer within the second wafer such that the plurality of second bonding pads are electrically connected to the plurality of second metal interconnect structures,
wherein forming the bonded assembly further comprises electrically bonding the plurality of first bonding pads to the plurality of second bonding pads.

4. The method of claim 3, wherein forming the bonded assembly further comprises:
placing the first wafer and the second wafer in contact with one another such that the plurality of first bonding pads are in contact with the plurality of second bonding pads and first portions of the first pad-level dielectric layer are in contact with second portions of the second pad-level dielectric layer;
performing a first annealing process to induce oxide-to-oxide bonding between the first pad-level dielectric layer and the second pad-level dielectric layer; and
performing a second annealing process to induce metal-to-metal bonding between the plurality of first bonding pads and the plurality of second bonding pads.

5. The method of claim 1, wherein etching the bonded assembly to form the inter-wafer moat trench further comprises:
forming the inter-wafer moat trench to extend from a backside surface of the second semiconductor substrate into a proximal portion of the first semiconductor substrate at a periphery of the bonded assembly.

6. The method of claim 1, wherein etching the bonded assembly to form an inter-wafer moat trench further comprises etching the bonded assembly to form the inter-wafer moat trench through the second semiconductor substrate and extending into the first semiconductor substrate, the method further comprising forming a protective material layer over the inter-wafer moat trench and on a sidewall of the first semiconductor substrate.

7. The method of claim 1, further comprising:
thinning the second semiconductor substrate to a first thickness; and
thinning the second semiconductor substrate to a second thickness that is less than the first thickness after removing the peripheral portion of the bonded assembly.

8. A method of forming a semiconductor structure, comprising:
forming a bonded assembly of a first wafer including a first semiconductor substrate and a second wafer including a second semiconductor substrate;
removing a peripheral portion of the bonded assembly, wherein removing the peripheral portion of the bonded assembly further comprises:
etching the bonded assembly to form a trench; and
removing the peripheral portion of the bonded assembly located outside the trench; and
dicing a cylindrical remaining portion of the bonded assembly to generate a plurality of semiconductor chips.

9. The method of claim 8, further comprising forming a cylindrical encapsulation dielectric layer over the cylindrical remaining portion of the bonded assembly prior to dicing the cylindrical remaining portion.

10. The method of claim 8, wherein etching the bonded assembly to form the trench further comprises:
a forming the trench to extend from a backside surface of the second semiconductor substrate into a proximal portion of the first semiconductor substrate at a periphery of the bonded assembly.

11. The method of claim 10, wherein removing the peripheral portion of the bonded assembly located outside the trench further comprises performing a blade-trimming process to cut off the peripheral portion of the second semiconductor substrate by a rotating blade.

12. The method of claim 8, further comprising:
forming through-substrate via cavities through the second semiconductor substrate within each die area of the second wafer such that an underlying metallic pad structure is physically exposed;
forming a through-substrate via structure that is electrically connected to the underlying metallic pad structure; and
forming a bonding pad that is electrically connected to the through-substrate via structure.

13. The method of claim 8, wherein dicing the cylindrical remaining portion of the bonded assembly further comprises:
dicing along first dicing channels that are parallel to one another and laterally extend along a first horizontal direction, wherein the first dicing channels are located between neighboring pairs of semiconductor dies within the first wafer and between neighboring pairs of semiconductor dies within the second wafer; and
dicing along second dicing channels that are parallel to one another and laterally extend along a second horizontal direction that is perpendicular to the first horizontal direction, wherein the second dicing channels are located between neighboring pairs of semiconductor dies within the first wafer and between neighboring pairs of semiconductor dies within the second wafer,
wherein each of the plurality of semiconductor chips generated by dicing along the first dicing channels and the second dicing channels includes a first semiconductor die that is a first singulated portion of the first wafer and a second semiconductor die that is a second singulated portion of the second wafer.

14. The method of claim 8, wherein forming the bonded assembly further comprises:
performing a first annealing process to induce oxide-to-oxide bonding between a first pad-level dielectric layer of the first wafer and a second pad-level dielectric layer of the second wafer; and performing a second annealing process to induce metal-to-metal bonding between first bonding pads of the first wafer and second bonding pads of the second wafer.

15. A method of forming a semiconductor structure, comprising:

forming a bonded assembly of a first wafer including a first semiconductor substrate and a second wafer including a second semiconductor substrate;

removing a cylindrical peripheral portion of the bonded assembly;

forming through-substrate via cavities through the second semiconductor substrate within each of a plurality of die areas of the second wafer such that an underlying metallic pad structure is physically exposed;

forming a through-substrate via structure that is electrically connected to the underlying metallic pad structure; and forming a bonding pad that is electrically connected to the through-substrate via structure.

16. The method of claim 15, further comprising forming through-substrate insulating spacers within each via cavity prior to forming the through-substrate via structure.

17. The method of claim 15, wherein removing the cylindrical peripheral portion of the bonded assembly further comprises:

forming an annular trench extending from a backside surface of the second semiconductor substrate into a proximal portion of the first semiconductor substrate at a periphery of the bonded assembly; and removing a peripheral portion of the bonded assembly located outside the annular trench.

18. The method of claim 17, wherein forming the annular trench further comprises:

performing an etching process to form the annular trench; or irradiating the bonded assembly with a laser beam to form the annular trench.

19. The method of claim 17, further comprising:

forming a protective material layer in the annular trench and over the backside surface of the second semiconductor substrate prior to removing the peripheral portion of the bonded assembly located outside the annular trench such that a cylindrical portion of the protective material layer laterally surrounds a remaining portion of the bonded assembly after removing the peripheral portion of the bonded assembly.

20. The method of claim 19, further comprising:

performing at least one thinning process to remove a horizontal portion of the protective material layer and a second backside portion of the second semiconductor substrate while the cylindrical portion of the protective material layer protects the remaining portion of the bonded assembly.

* * * * *